United States Patent
Pan et al.

(10) Patent No.: US 8,669,623 B2
(45) Date of Patent: Mar. 11, 2014

(54) STRUCTURE RELATED TO A THICK BOTTOM DIELECTRIC (TBD) FOR TRENCH-GATE DEVICES

(75) Inventors: James Pan, West Jordan, UT (US); Christopher Lawrence Rexer, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 260 days.

(21) Appl. No.: 12/870,600

(22) Filed: Aug. 27, 2010

(65) Prior Publication Data

US 2010/0320534 A1    Dec. 23, 2010

Related U.S. Application Data

(63) Continuation of application No. 12/143,510, filed on Jun. 20, 2008, now Pat. No. 7,807,576.

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl.
USPC ........... 257/396; 257/288; 257/281; 257/284; 257/E21.027; 257/E21.051; 257/E21.058; 257/E21.17; 257/E21.221; 257/E21.267; 257/E21.351; 257/E21.364; 257/E21.545; 257/E21.546

(58) Field of Classification Search
USPC ......... 257/396, 288, 281, 284, 192, 330, 401, 257/E21.027, E21.051, E21.058, E21.17, 257/E21.267, E21.221, E21.351, E21.364, 257/E21.214, E21.545, E21.546, E21.229, 257/E21.278, E21.293
See application file for complete search history.

(56) References Cited

U.S. PATENT DOCUMENTS

| | | | |
|---|---|---|---|
| 4,399,449 A | 8/1983 | Herman et al. | |
| 4,455,565 A | 6/1984 | Goodman et al. | |
| 4,941,026 A | 7/1990 | Temple | |

(Continued)

FOREIGN PATENT DOCUMENTS

| | | |
|---|---|---|
| EP | 1 054 451 A2 | 11/2000 |
| EP | 1170803 A2 | 1/2002 |

(Continued)

OTHER PUBLICATIONS

Notice of Allowance for U.S. Appl. No. 12/143,510 mailed on Jun. 1, 2010; 6 pages.

(Continued)

*Primary Examiner* — David Nhu

(57) ABSTRACT

A semiconductor structure which includes a shielded gate FET is formed as follows. A plurality of trenches is formed in a semiconductor region using a mask. The mask includes (i) a first insulating layer over a surface of the semiconductor region, (ii) a first oxidation barrier layer over the first insulating layer, and (iii) a second insulating layer over the first oxidation barrier layer. A shield dielectric is formed extending along at least lower sidewalls of each trench. A thick bottom dielectric (TBD) is formed along the bottom of each trench. The first oxidation barrier layer prevents formation of a dielectric layer along the surface of the semiconductor region during formation of the TBD. A shield electrode is formed in a bottom portion of each trench. A gate electrode is formed over the shield electrode in each trench.

30 Claims, 16 Drawing Sheets

(56) References Cited

U.S. PATENT DOCUMENTS

| | | |
|---|---|---|
| 4,992,390 A | 2/1991 | Chang |
| 5,126,807 A | 6/1992 | Baba et al. |
| 5,179,032 A | 1/1993 | Quigg |
| 5,429,964 A | 7/1995 | Yilmaz et al. |
| 5,508,534 A | 4/1996 | Nakamura et al. |
| 5,763,915 A | 6/1998 | Hshieh et al. |
| 5,898,198 A | 4/1999 | Herbert et al. |
| 5,912,490 A | 6/1999 | Hebert et al. |
| 5,918,137 A | 6/1999 | Ng et al. |
| 5,998,833 A | 12/1999 | Baliga |
| 6,037,202 A | 3/2000 | Witek |
| 6,150,675 A | 11/2000 | Franke et al. |
| 6,198,127 B1 | 3/2001 | Kocon |
| 6,262,439 B1 | 7/2001 | Takeuchi et al. |
| 6,262,453 B1 * | 7/2001 | Hshieh ........................ 257/341 |
| 6,265,269 B1 | 7/2001 | Chen et al. |
| 6,274,905 B1 | 8/2001 | Mo |
| 6,291,298 B1 | 9/2001 | Williams et al. |
| 6,351,018 B1 | 2/2002 | Sapp |
| 6,433,385 B1 | 8/2002 | Kocon et al. |
| 6,437,386 B1 | 8/2002 | Hurst et al. |
| 6,489,652 B1 | 12/2002 | Jeon et al. |
| 6,580,123 B2 | 6/2003 | Thapar |
| 6,600,182 B2 | 7/2003 | Rumennik |
| 6,649,459 B2 | 11/2003 | Deboy et al. |
| 6,653,691 B2 | 11/2003 | Baliga |
| 6,673,681 B2 | 1/2004 | Kocon et al. |
| 6,683,346 B2 | 1/2004 | Zeng |
| 6,690,062 B2 | 2/2004 | Henninger et al. |
| 6,720,616 B2 | 4/2004 | Hirler et al. |
| 6,750,508 B2 | 6/2004 | Omura et al. |
| 6,803,626 B2 | 10/2004 | Sapp et al. |
| 6,806,533 B2 | 10/2004 | Henninger et al. |
| 6,809,375 B2 | 10/2004 | Takemori et al. |
| 6,833,584 B2 | 12/2004 | Henninger et al. |
| 6,852,597 B2 | 2/2005 | Park et al. |
| 6,861,296 B2 | 3/2005 | Hurst et al. |
| 6,861,701 B2 | 3/2005 | Williams et al. |
| 6,870,220 B2 | 3/2005 | Kocon et al. |
| 6,891,223 B2 | 5/2005 | Krumrey et al. |
| 6,903,412 B2 | 6/2005 | Darwish et al. |
| 6,987,305 B2 | 1/2006 | He et al. |
| 7,009,247 B2 | 3/2006 | Darwish |
| 7,015,104 B1 | 3/2006 | Blanchard |
| 7,023,069 B2 | 4/2006 | Blanchard |
| 7,041,560 B2 | 5/2006 | Hshieh |
| 7,084,455 B2 | 8/2006 | Blanchard |
| 7,199,006 B2 | 4/2007 | Hshieh |
| 7,199,403 B2 | 4/2007 | Tihanyi |
| 7,208,358 B2 | 4/2007 | Kusumoto et al. |
| 7,208,385 B2 | 4/2007 | Hossain et al. |
| 7,232,726 B2 | 6/2007 | Peake et al. |
| 7,291,899 B2 | 11/2007 | Falck et al. |
| 7,319,256 B1 | 1/2008 | Kraft et al. |
| 7,344,943 B2 | 3/2008 | Herrick et al. |
| 7,345,342 B2 | 3/2008 | Challa et al. |
| 7,352,036 B2 | 4/2008 | Grebs |
| 7,382,019 B2 | 6/2008 | Marchant et al. |
| 7,485,532 B2 | 2/2009 | Marchant et al. |
| 7,504,303 B2 * | 3/2009 | Yilmaz et al. .................. 438/259 |
| 7,612,408 B2 | 11/2009 | Zundel et al. |
| 7,648,877 B2 * | 1/2010 | Andrews ........................ 438/270 |
| 7,790,589 B2 | 9/2010 | Eggenkamp et al. |
| 7,807,576 B2 * | 10/2010 | Pan ................................ 438/700 |
| 7,910,437 B1 | 3/2011 | Baek et al. |
| 8,299,524 B2 | 10/2012 | Takaishi |
| 2001/0023961 A1 | 9/2001 | Hshieh et al. |
| 2002/0036326 A1 | 3/2002 | DeJong et al. |
| 2003/0209757 A1 | 11/2003 | Henninger et al. |
| 2004/0031987 A1 | 2/2004 | Henninger et al. |
| 2004/0089910 A1 | 5/2004 | Hirler et al. |
| 2004/0157384 A1 | 8/2004 | Blanchard |
| 2004/0196679 A1 | 10/2004 | Apeland et al. |
| 2004/0214397 A1 | 10/2004 | Thapar |
| 2005/0056886 A1 | 3/2005 | Tihanyi |
| 2005/0167742 A1 | 8/2005 | Challa et al. |
| 2005/0242392 A1 | 11/2005 | Pattanayak et al. |
| 2006/0019448 A1 | 1/2006 | Darwish et al. |
| 2006/0071276 A1 | 4/2006 | Zundel et al. |
| 2006/0231915 A1 | 10/2006 | Hshieh et al. |
| 2006/0273379 A1 | 12/2006 | Bhalla et al. |
| 2006/0273386 A1 | 12/2006 | Yilmaz et al. |
| 2006/0275993 A1 | 12/2006 | Fong |
| 2006/0289929 A1 | 12/2006 | Andrews |
| 2007/0069324 A1 | 3/2007 | Takaishi |
| 2007/0138548 A1 | 6/2007 | Kocon et al. |
| 2007/0187695 A1 | 8/2007 | Nakamura et al. |
| 2007/0187753 A1 | 8/2007 | Pattanayak et al. |
| 2007/0274014 A1 | 11/2007 | Berberich et al. |
| 2008/0017920 A1 | 1/2008 | Sapp et al. |
| 2008/0093641 A1 | 4/2008 | Ludikhuize et al. |
| 2008/0173969 A1 | 7/2008 | Hebert et al. |
| 2008/0261358 A1 | 10/2008 | Sonsky |
| 2009/0085107 A1 | 4/2009 | Hshieh |
| 2009/0315083 A1 | 12/2009 | Pan et al. |
| 2010/0163950 A1 | 7/2010 | Gladish et al. |

FOREIGN PATENT DOCUMENTS

| | | |
|---|---|---|
| EP | 1 369 927 A2 | 12/2003 |
| JP | 63-296282 A | 12/1988 |
| JP | 01192174 A | 8/1989 |
| JP | 1192175 A | 8/1989 |
| JP | 3211885 A | 9/1991 |
| WO | 00/33386 A2 | 6/2000 |
| WO | 00/42665 A1 | 7/2000 |
| WO | 01/45155 A1 | 6/2001 |
| WO | 01/59847 A2 | 8/2001 |
| WO | 01/88997 A2 | 11/2001 |
| WO | 03/023861 A2 | 3/2003 |

OTHER PUBLICATIONS

Non-Final Office Action for U.S. Appl. No. 12/143,510 mailed on Jan. 26, 2010; 9 pages.

Requirement for Restriction for U.S. Appl. No. 12/143,510 mailed on Nov. 6, 2009; 6 pages.

Barkhordarian, Vrej, "Power MOSFET Basics", International Rectifier, El Segundo, CA., Apr. 3, 2003, 13 pages.

Kim, Jongdae, et al., "A Novel Process for Fabricating High Density Trench MOSFETs for DC-DC Converters", ETRI Journal, vol. 24, No. 5, Oct. 2002, pp. 333-340.

Peake, Steven T., et al., "A Fully Realized 'Field Balanced' TrenchMOS Technology", Proceedings of the 20th International Symposium on Power Semiconductor Devices & IC's, May 18-22, 2008, pp. 28-31.

Berberich, et al., "High Voltage 3D-Capacitor" Sep. 2-5, 2007, 2007 European Conference on Power Electronics and Applications, pp. 1-9.

Severns, R., "Design of Snubbers for Power Circuits", EMI-Reduce-International Rectifier Corporation, 2006, 30 pages.

* cited by examiner

STRUCTURE RELATED TO A THICK BOTTOM DIELECTRIC (TBD) FOR TRENCH-GATE DEVICES

CROSS-REFERENCE TO RELATED APPLICATIONS

This application is a continuation of U.S. application Ser. No. 12/143,510, filed Jun. 20, 2008, which is incorporated herein by reference in its entirety for all purposes.

BACKGROUND

The present invention relates in general to semiconductor technology and in particular to a structure and method for forming a thick bottom dielectric (TBD) for trench-gate devices.

An important parameter in trench power metal-oxide-semiconductor field-effect transistors (MOSFETs) is the total gate charge. In some applications of conventional trench power MOSFETs, such as DC-DC converters, the lower the gate charge the better the efficiency of the overall design. One technique in reducing the gate charge is to reduce the gate to drain capacitance by using a thick dielectric along the bottom of the gate trench.

A conventional local oxidation of silicon (LOCOS) process is commonly used to form the thick dielectric along the bottom of the trench. This process often involves forming a silicon nitride layer along the trench sidewalls to protect the sidewalls during formation of the thick dielectric. However, the anisotropic etch used to remove the silicon nitride along the bottom of the trench also removes the silicon nitride extending over the mesa surfaces adjacent the trenches. As a result, during formation of the thick dielectric along the bottom of the trench, a similarly thick dielectric is formed over the mesa surfaces adjacent to the trench.

A thick dielectric over the mesa surfaces can cause a number of problems. First, the thick dielectric typically overhangs the upper trench corners, which can cause voiding in the gate polysilicon. Additionally, removing the thick dielectric from over the mesa surfaces requires substantial etching, which can also etch the gate oxide along the upper trench sidewalls leading to gate shorts and yield problems. Also, variability in the thickness of the dielectric over the mesa surfaces can cause variability in the body implant process causing variability in the electrical parameters of the device.

Thus, there is a need for improved techniques for forming a thick dielectric along the bottom of a gate trench.

BRIEF SUMMARY

In accordance with an embodiment of the invention, a method of forming a semiconductor structure which includes a trench gate field effect transistor (FET) includes the following steps. A plurality of trenches are formed in a semiconductor region using a mask which includes: (i) a first insulating layer over a surface of the semiconductor region, (ii) a first oxidation barrier layer over the first insulating layer, and (iii) a second insulating layer over the first oxidation barrier layer. A thick bottom dielectric (TBD) is formed along the bottom of each trench. The first oxidation barrier layer prevents formation of a dielectric layer along the surface of the semiconductor region during formation of the TBD.

In one embodiment, at least a portion of the second insulating layer remains over the first oxidation barrier layer following formation of the plurality of trenches.

In another embodiment, the semiconductor region comprises silicon, and the TBD is formed by oxidizing the silicon using a local oxidation of silicon (LOCOS) process.

In another embodiment, a second oxidation barrier layer is formed that extends along the opposing sidewalls of each trench but is discontinuous along the bottom of each trench. The second oxidation barrier layer prevents formation of a dielectric layer along the opposing sidewalls of each trench during formation of the TBD.

In another embodiment, prior to forming the second oxidation barrier layer, a third insulating layer is formed along the opposing sidewalls and along the bottom of each trench.

In another embodiment, the semiconductor region comprises silicon, and the bottom corners of each trench are rounded using a silicon etch process. The second insulating layer protects the first oxidation barrier layer during the silicon etch process.

In another embodiment, a gate electrode is formed in each trench over and in contact with the TBD.

In yet another embodiment, the trench gate FET is formed in one or more FET regions of the semiconductor structure, and the semiconductor structure also includes one or more Schottky regions. In the FET regions, a body region is formed in the semiconductor region, and source regions are formed in the body region adjacent to each trench.

In still another embodiment, an interconnect layer is formed in the one or more FET regions and in the one or more Schottky regions. The interconnect layer contacts mesa surfaces between adjacent trenches in the one or more Schottky regions to form a Schottky contact. The interconnect layer also contacts the source regions in the one or more FET regions.

In accordance with another embodiment of the invention, a method for forming a semiconductor structure which includes a shielded gate FET includes the following steps. A plurality of trenches are formed in a semiconductor region using a mask which includes: (i) a first insulating layer over a surface of the semiconductor region, (ii) a first oxidation barrier layer over the first insulating layer, and (iii) a second insulating layer over the first oxidation barrier layer. A shield dielectric is formed that extends along at least lower sidewalls of each trench. A thick bottom dielectric (TBD) is formed along the bottom of each trench. The first oxidation barrier layer prevents formation of a dielectric layer along the surface of the semiconductor region during formation of the TBD. A shield electrode is formed disposed in a bottom portion of each trench, and a gate electrode is formed over the shield electrode.

In one embodiment, the semiconductor region includes a drift region extending over a substrate. The drift region has a lower doping concentration than the substrate. The plurality of trenches is formed to extend through the drift region and terminate within the substrate.

In another embodiment, prior to forming the gate electrode, an inter-electrode dielectric (IED) layer is formed over the shield electrode.

In another embodiment, forming the IED layer comprises depositing and oxide layer and recessing the oxide layer into each trench. The first oxidation barrier layer protects the surface of the semiconductor region during recessing the oxide layer.

In yet another embodiment, a gate dielectric is formed lining the upper sidewalls of each trench. In some embodiments, the gate dielectric is thinner than the shield dielectric.

The following detailed description and the accompanying drawings provide a better understanding of the nature and advantages of the present invention.

DETAILED DESCRIPTION

In accordance with an embodiment of the invention, a thick dielectric layer is formed along the bottom of the trenches in a trench-gate FET while a similarly thick dielectric layer is prevented from forming over the mesa surfaces of the semiconductor region adjacent to each trench. An oxidation barrier layer protects the mesa surfaces during formation of the thick dielectric layer. This oxidation barrier layer is protected by an overlying insulating layer during trench formation and the trench corner rounding process. These and other advantages and features of the invention will be described more fully in the context of exemplary embodiments next.

FIGS. 1A-1I show cross-section views at various steps in a manufacturing process for forming a trench-gate FET with a TBD in accordance with an embodiment of the invention. The following description of the steps in the process flow is only exemplary, and it should be understood that the scope of the invention is not to be limited to these particular examples. For example, processing conditions such as temperature, pressure, layer thickness and the like could be varied without departing from the spirit of the invention.

Figure 1A:
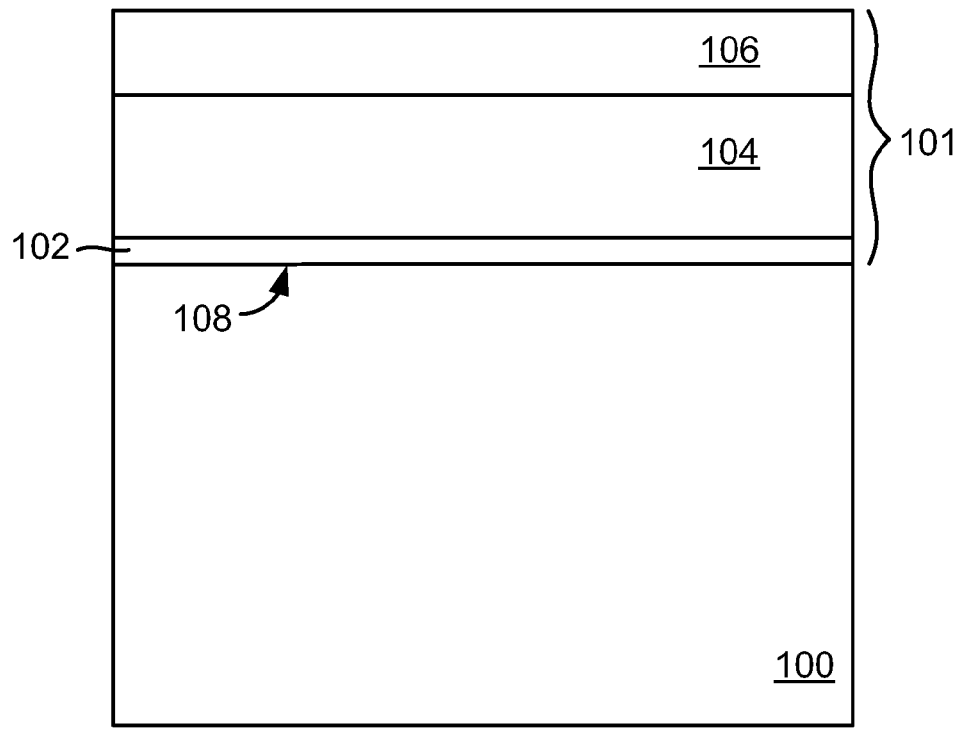
FIGS. 1A-1I show simplified cross-section views at various steps in a manufacturing process for forming a semiconductor structure that includes trench-gate FET with a thick bottom dielectric (TBD), in accordance with an embodiment of the invention.

In FIG. 1A, semiconductor region 100 is provided as the basis for forming the trench-gate FET. In one embodiment, semiconductor region 100 includes an N-type epitaxial layer formed over a highly doped N+ type substrate. Hard mask 101 includes three layers and is formed over surface 108 of semiconductor region 100. In one embodiment, hard mask 101 includes first insulating layer 102, first oxidation barrier layer 104, and second insulating layer 106.

First insulating layer 102 is formed over surface 108 of semiconductor region 100. In one embodiment, first insulating layer 102 comprises pad oxide having a thickness in the range of 50-300 Å and is formed using conventional techniques.

First oxidation barrier layer 104 is formed over first insulating layer 102. In one embodiment, layer 102 comprises pad oxide and layer 104 comprises silicon nitride. The silicon nitride may have a thickness in the range of 1800-2200 Å and be formed using a conventional low pressure chemical vapor deposition (LPCVD) process. The pad oxide improves adhesion of the silicon nitride layer and serves as a buffer between semiconductor region 100 and the higher stress silicon nitride layer. The silicon nitride layer acts as an oxidation barrier to prevent formation of a thick dielectric over the mesa surfaces during the process for forming a TBD depicted in FIG. 1H. Oxidation inhibiting material other than silicon nitride may also be used, and the precise characteristics of first oxidation barrier layer 104 may be varied by changes to gas ratios, temperature, pressure, and spacing of the components in the deposition chamber.

Second insulating layer 106 is formed over first oxidation barrier layer 104. In one embodiment, second insulating layer 106 comprises oxide having a thickness in the range of 1300-1700 Å and may be formed using a standard chemical vapor deposition (CVD) process. Other materials exhibiting similar characteristics may also be used.

Figure 1B:
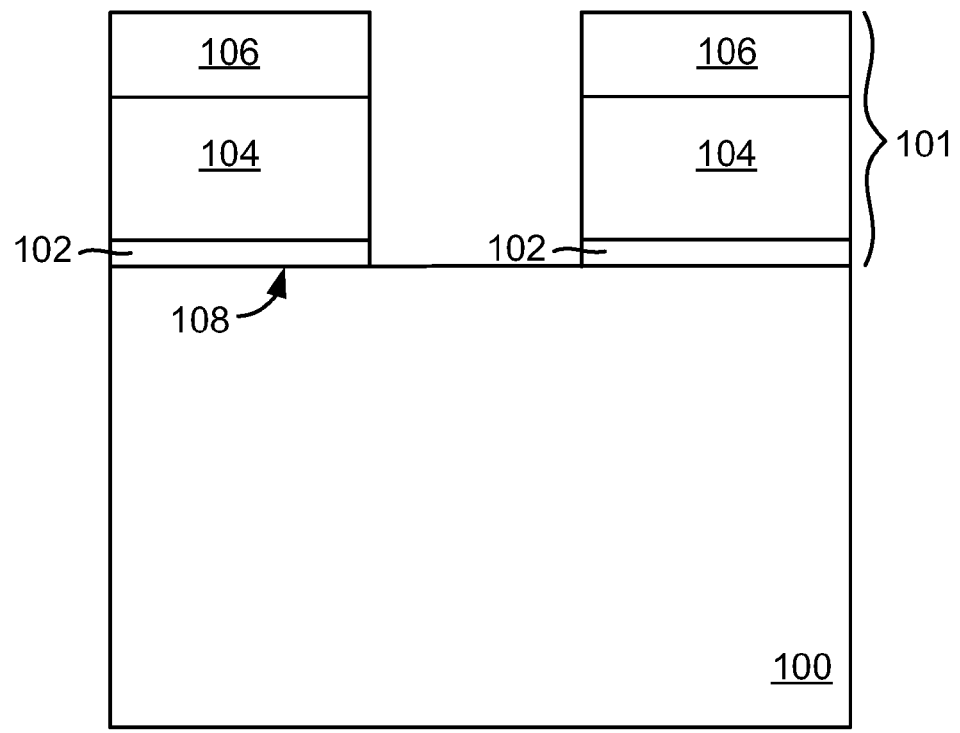
Figure 1C:
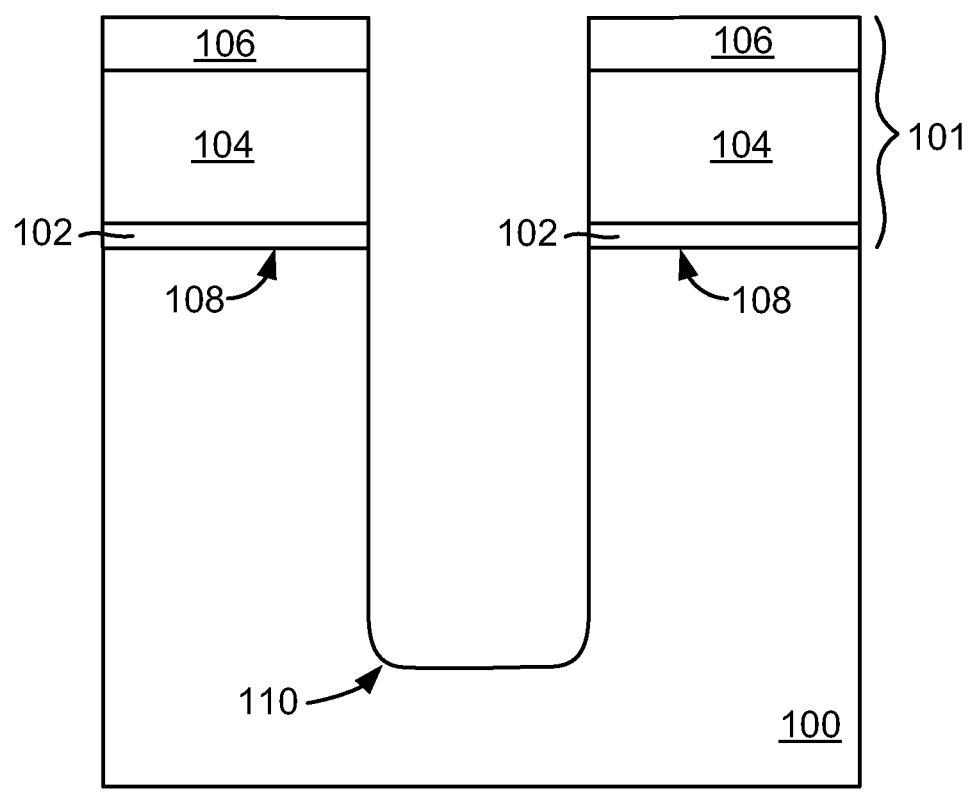

In FIG. 1B, hard mask 101 is patterned using a photo resist layer (not shown) and standard photolithography and etching techniques. In FIG. 1C, a conventional anisotropic etch process may be used to form trench 110 extending into semiconductor region 100. As illustrated in FIG. 1C, a top layer of second insulating layer 106 may be removed during the trench etch process thus reducing the thickness of second insulating layer 106. However, second insulating layer 106 may be formed to have sufficient thickness so that at least a portion of second insulating layer 106 remains following the trench etch step. The remaining portion of second insulating layer 106 protects the underlying first oxidation barrier layer 104 from certain etch process(es) in subsequent steps. Following trench formation, surfaces 108 adjacent to trench 110 form the mesa surfaces referred to previously.

Figure 1D:
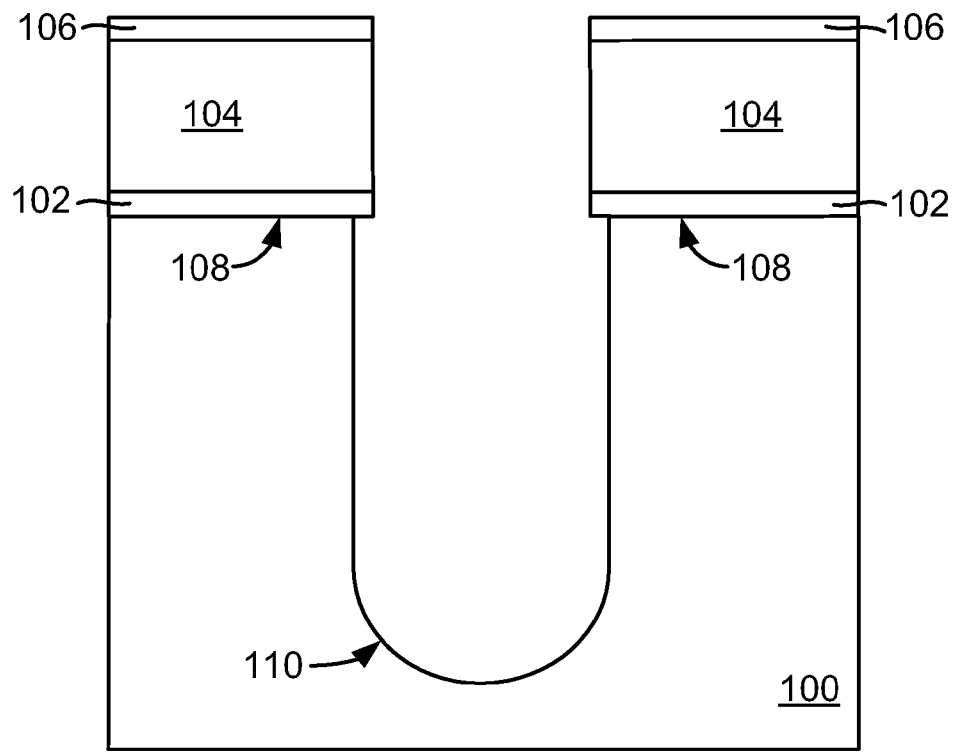

In FIG. 1D, the bottom corners of trench 110 are rounded to reduce defect density. In one embodiment, semiconductor region 100 comprises silicon, and the corners are rounded using a process that etches silicon. As illustrated in FIG. 1D, the process may remove portions of semiconductor region 100 along the sidewalls of trench 110 thus recessing the sidewalls. In one embodiment, second insulating layer 106 is resistant to the silicon etch and thus protects first oxidation barrier layer 104 during the silicon etch process.

Figure 1E:
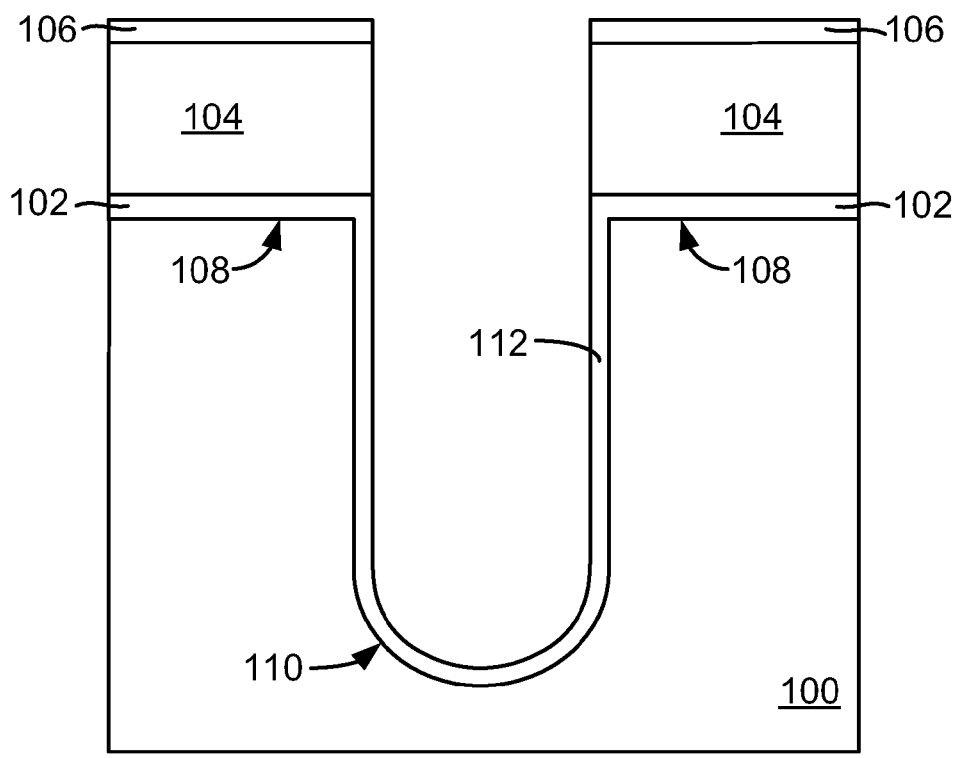

In FIG. 1E, third insulating layer 112 is formed covering the bottom and sidewalls of trench 110. In one embodiment, third insulating layer 112 comprises thermal oxide having a thickness in the range of 100-400 Å and may be formed using conventional thermal oxidation techniques. First oxidation barrier layer 104 prevents formation of third insulating layer 112 over mesa surfaces 108.

Figure 1F:
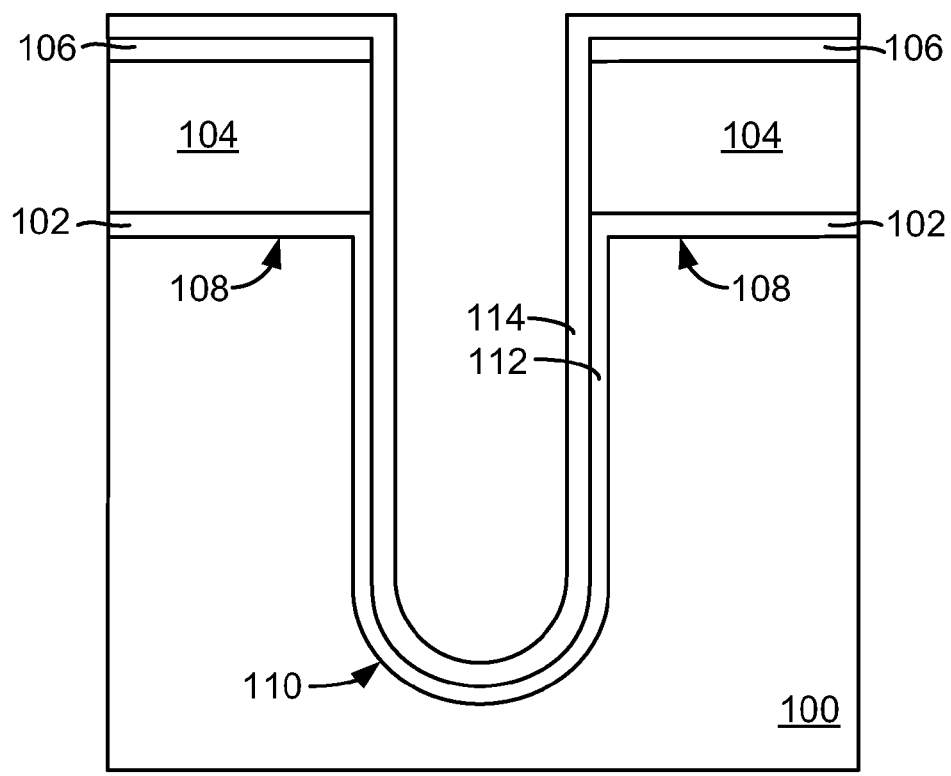

In FIG. 1F, second oxidation barrier layer 114 is formed over third insulating layer 112 along the sidewalls and bottom of trench 110 and over hard mask 101. In one embodiment, layer 112 comprises oxide and layer 114 comprises silicon nitride. The silicon nitride may be formed using a conventional LPCVD process. The oxide improves adhesion of the silicon nitride layer and serves to protect the underlying semiconductor region 100 along the bottom of trench 110 during the etch carried out in the next process step depicted in FIG. 1G. Oxidation inhibiting material other than nitride may also be used, and the precise characteristics of second oxidation barrier layer 114 may be varied by changes to gas ratios, temperature, pressure, and spacing of the components in the deposition chamber.

Figure 1G:
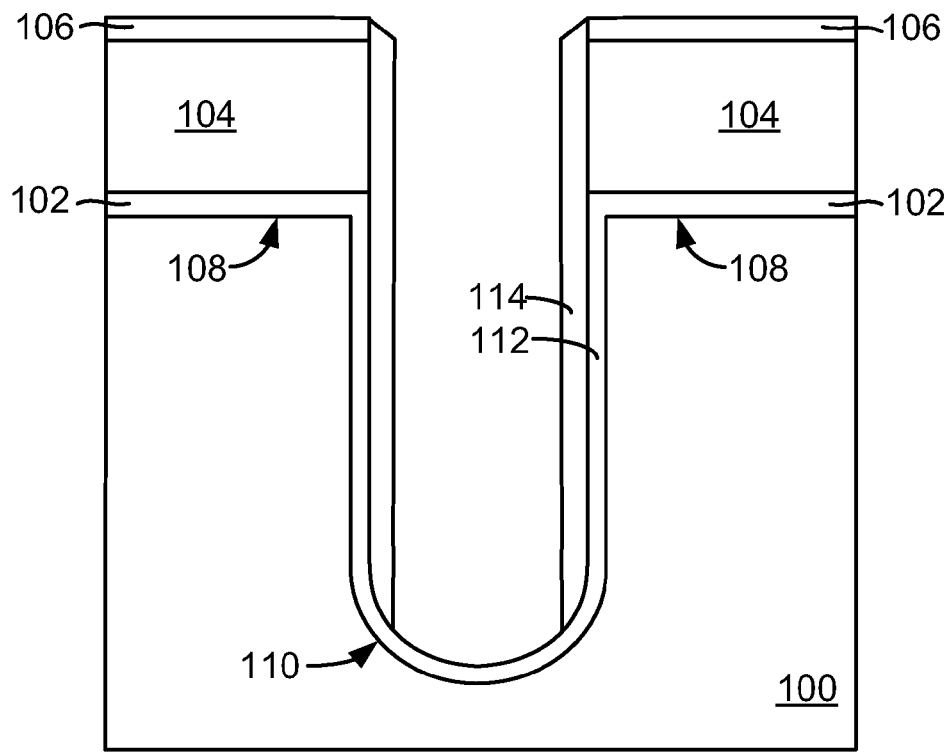

In FIG. 1G, second oxidation barrier layer 114 is removed from the surface of hard mask 101 and along the bottom of trench 110 using a conventional anisotropic etch process. Portions of second oxidation barrier layer 114 remain along the opposing sidewalls of trench 110, e.g., in the form of nitride spacers. In some embodiments, a variety of conventional etchant materials and etch environments may be used. Etch variables such as gas, gas ratio, and RF power may be tuned in accordance with known techniques to accomplish the desired anisotropic etch process.

Figure 1H:
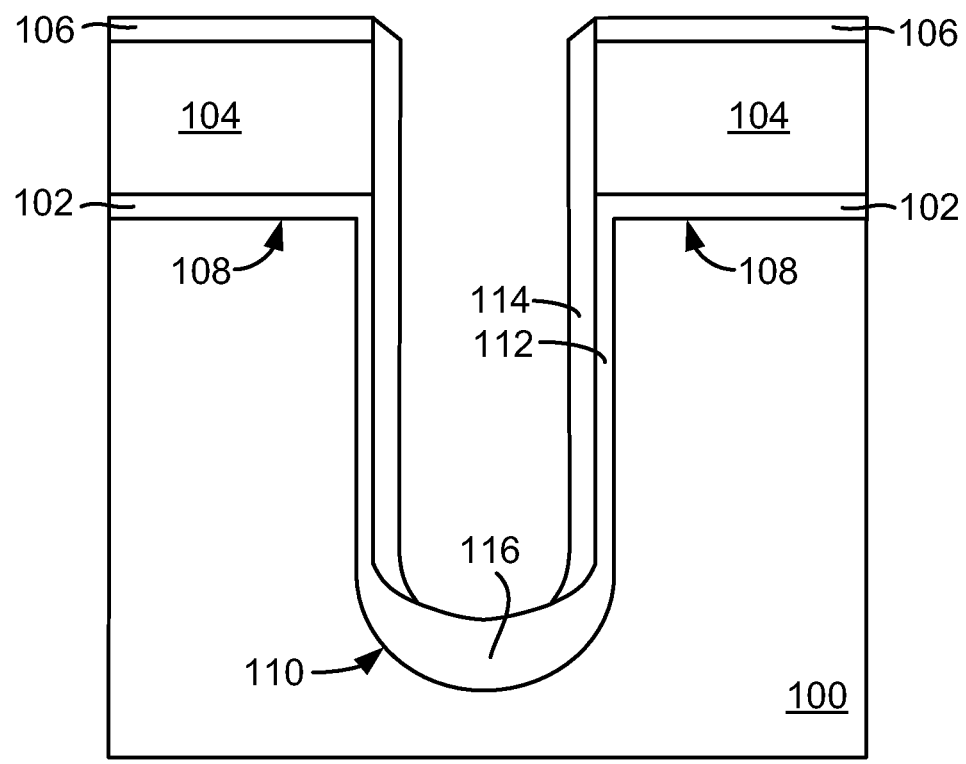

In FIG. 1H, TBD 116 is formed along the bottom of trench 110. In one embodiment, semiconductor region 100 comprises silicon, and TBD 116 is formed by oxidizing the silicon using a conventional local oxidation of silicon (LOCOS) process. Second oxidation barrier layer 114 inhibits sidewalls of trench 110 from oxidizing, and first oxidation barrier layer 104 inhibits mesa surfaces 108 from oxidizing. In one embodiment, TBD 116 has a thickness in the range of 2000-3000 Å. The process can be either a wet or dry oxidation depending on the capability of second oxidation barrier layer 114.

Figure 1I:
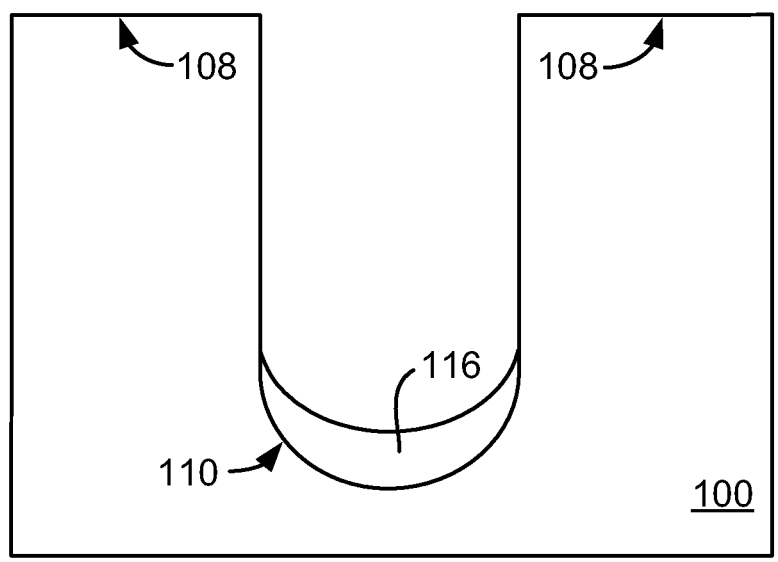

In FIG. 1I, conventional etch processes are carried out to remove second oxidation barrier layer 114 and third insulating layer 112 from the sidewalls of trench 110 and to remove the remaining portions of hard mask 101. In an exemplary embodiment, conventional oxide etch processes may be used to remove first, second, and third insulating layers 102, 106, and 112, and conventional silicon nitride etch processes may be used to remove first and second oxidation barrier layers 104 and 114. The oxide etch process may also remove a thin layer off the top of TBD 116. However, this amount may be compensated for by modifying the dielectric growth recipe parameters during the formation of TBD 116. Further, using a thin first insulating layer 102 ensures that only a thin layer of TBD 116 is removed when removing first insulating layer 102. In one embodiment, only TBD 116 remains along the bottom of trench 110 following the etch process(es) as shown in FIG. 1I. In another embodiment, third insulating material may be retained and may serve as the gate dielectric of a field effect transistor.

Figure 2:
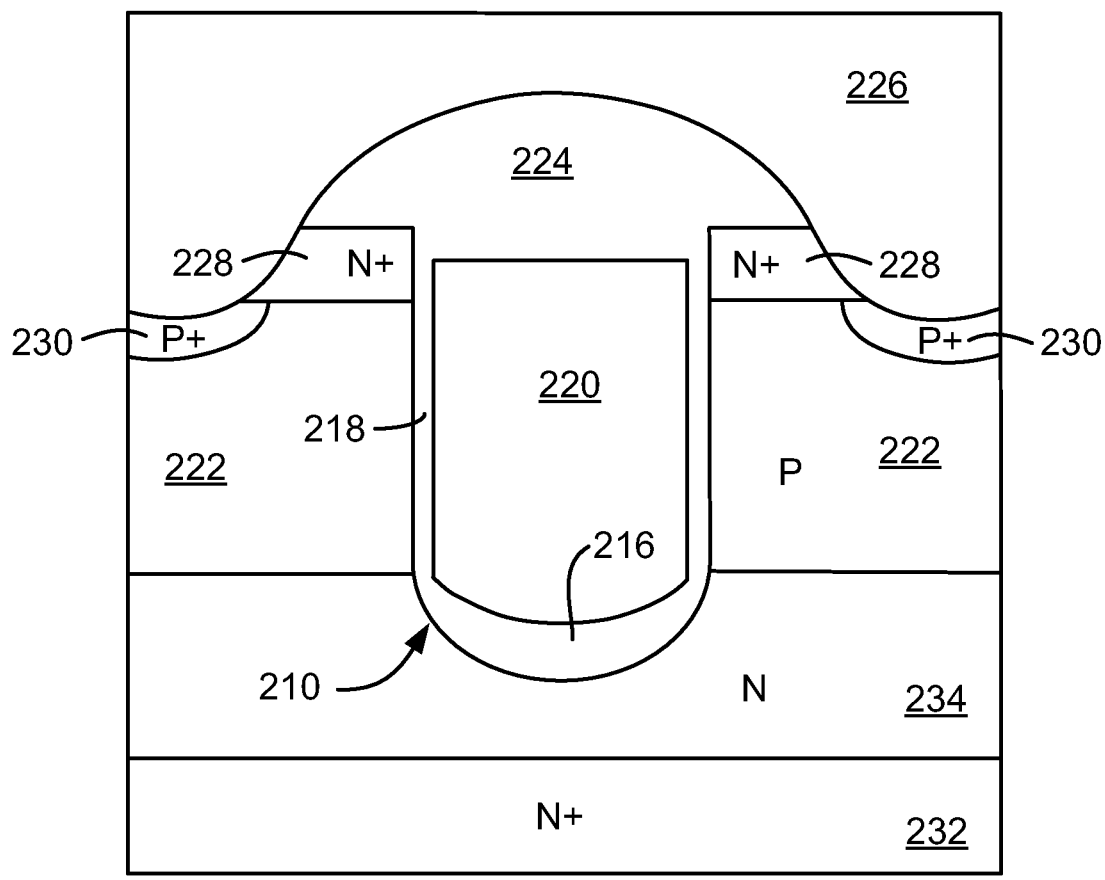
FIG. 2 shows a simplified cross-section view of a trench-gate FET structure, in accordance with an embodiment of the invention.

With the formation of TBD 116, the remaining portions of the trench-gate FET structure can be formed using any one of a number of known techniques. FIG. 2 shows a cross-section view of such a trench-gate FET structure, in accordance with an embodiment of the invention.

In FIG. 2, an epitaxial layer 234 that is doped N-type overlies a highly doped N+ substrate 232. Body region 222 of P-type conductivity and source regions 228 of N-type conductivity are formed in an upper portion of epitaxial layer 234 using conventional ion implantation techniques. The portion of epitaxial layer 234 that is bounded by body region 222 and substrate 232 is commonly referred to as the drift region. The drift region and substrate 232 form the drain region of the FET. Trench 210 extends into epitaxial layer 234 and terminates within the drift region. Alternatively, trench 210 may be extended deeper to terminate within substrate 232. Gate dielectric layer 218 is formed along the trench sidewalls in the embodiment where third insulating layer 112 is removed in an earlier step. Recessed gate electrode 220 is formed in trench 210 over TBD 216 and gate dielectric layer 218 using known techniques. Body region 222 may be formed prior to forming trenches 210 or after forming gate electrode 220, or at another stage of the process.

The cross section in FIG. 2 corresponds to an embodiment where an open cell configuration is used with source regions 228 and trench 210 being stripe-shaped and extending parallel to one another. In this embodiment, conventional techniques are used to form heavy body regions 230 of P-type conductivity periodically or continuously along the source stripes. Heavy body regions 230 are formed in body regions 222 using known techniques. A dielectric layer (e.g., BPSG) is formed over the structure and then patterned. Following a reflow process, the dielectric layer forms dielectric dome 224 extending over trench 210. A top interconnect layer 226 (e.g., comprising metal) that electrically contacts source regions 228 and heavy body regions 230 may be formed over the entire structure. A backside drain interconnect layer (not shown) may also be formed to contact the backside of substrate 232. The method of the present invention is not limited to an open cell configuration. The implementation of the present invention in a closed cell configuration would be obvious to one skilled in the art in view of this disclosure.

As can be seen in FIGS. 1C-1D, second insulating layer 106 covers and protects first oxidation barrier layer 104 during trench formation and during the trench corner rounding processes. By preserving first oxidation barrier layer 104, a thick dielectric is prevented from forming over surfaces 108 during formation of TBD 116. This is advantageous for a number of reasons. The absence of a thick dielectric over surfaces 108 greatly reduces the chance of polysilicon voiding, thus improving manufacturing yield. Also, there is no need to remove the thick dielectric from over the mesa surfaces, thus reducing the number of processing steps and eliminating the possibility of removing portions of the gate dielectric from along the upper trench sidewalls. In addition, the absence of the thick dielectric over the mesa surfaces reduces the variability in the body implant process, thus allowing for better controlled implant characteristics as well as reducing variations in the electrical parameters of the transistor.

The process depicted by FIGS. 1A-1I and the trench-gate FET structure shown in FIG. 2 can also be advantageously integrated with other device structures. For example, FIG. 3 shows a cross-section view of a monolithically integrated trench-gate FET and Schottky diode commonly referred to as a SynchFET, in accordance with another embodiment of the invention.

Figure 3:
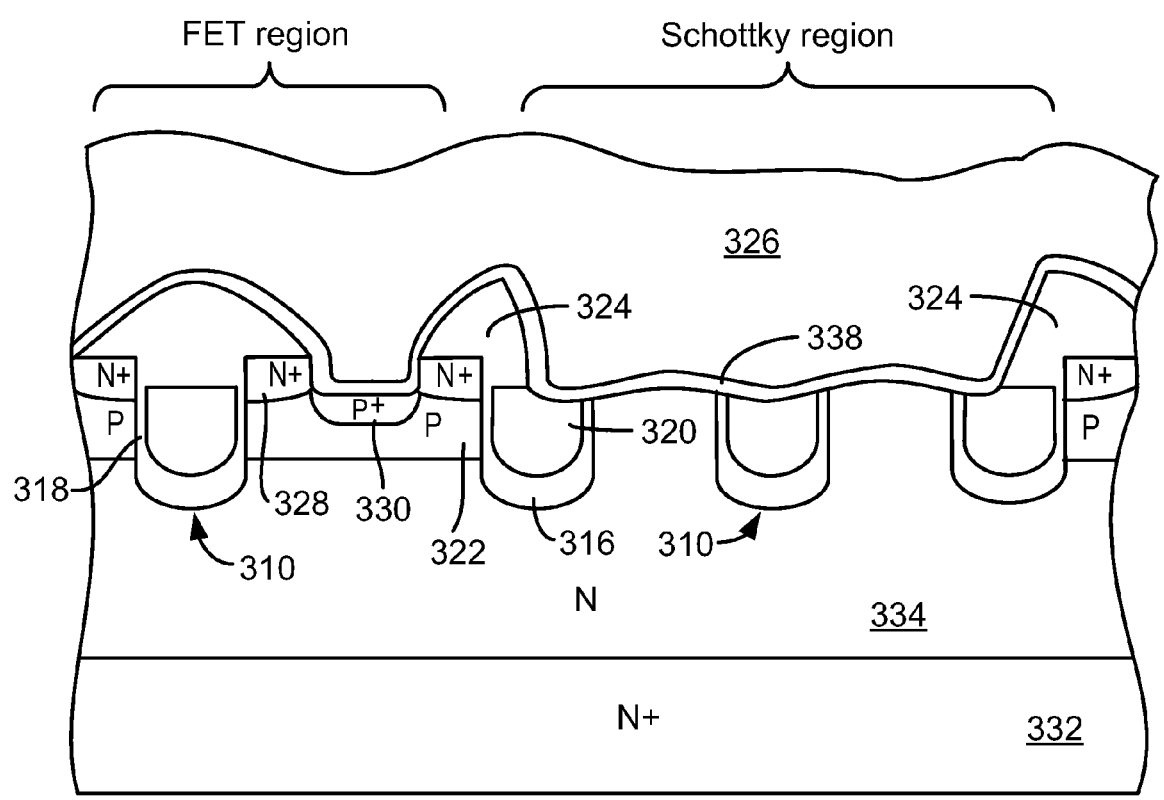
FIG. 3 shows a simplified cross-section view of a monolithically integrated trench-gate FET and Schottky diode, in accordance with another embodiment of the invention.

In FIG. 3, N-type epitaxial layer 334 overlies a highly doped N+ type substrate 332. A plurality of trenches 310 extend to a predetermined depth within epitaxial layer 334. Gate dielectric 318, which is thinner than TBD 316, lines the sidewalls of trenches 310. A gate electrode 320 is embedded in each trench 310. In one embodiment, gate electrodes 320 comprise polysilicon. A dielectric cap 324 extends over each gate electrode 320 in the FET region.

P-type body regions 322 are located between adjacent trenches 310 in the FET region and extend along the trench sidewalls. Highly doped N+ type source regions 328 are located directly above body regions 322 adjacent to the trench sidewalls. Source regions 328 vertically overlap gate electrode 320. In one embodiment, body regions 322 and source regions 328 are formed in an upper portion of epitaxial layer 334. When the trench-gate MOSFET is turned on, a vertical channel is formed in body regions 322 between each source region 328 and epitaxial layer 334 along the trench sidewalls.

In FIG. 3, a conformal barrier layer 338 is formed over the FET and Schottky regions. As can be seen, barrier layer 338 is substantially planar in the Schottky region and extends over dielectric caps 324 in the FET region. Conductive layer 326 (e.g., comprising aluminum) is formed over barrier layer 338. Conductive layer 326 and barrier layer 338 form the source interconnect. In the FET region, the source interconnect electrically contacts heavy body regions 330 and source regions 328 but is insulated from gate electrodes 320. In the Schottky region, a Schottky contact is formed where the source interconnect contacts the mesa surfaces between adjacent trenches. Thus, interconnect layer 326 serves as the anode electrode of the Schottky diode in the schottky region and as the source interconnect of the FET in the FET region. Interconnect 326 also contacts gate electrodes 320 in the Schottky region. Thus, gate electrodes 320 in the Schottky region are electrically biased to the source potential during operation. A backside interconnect (not shown) contacting substrate 332 serves as the drain interconnect in the FET region and as the cathode electrode in the Schottky region. The process depicted in FIGS. 1A-1I can be used to form TBD 116 in both the FET and Schottky regions. The process steps for forming the substantially planar surface in the Schottky region are described in the commonly assigned patent application Ser. No. 11/747,847, titled "Structure and Method for Forming a Planar Schottky Contact", filed May 11, 2007, which is incorporated herein by reference in its entirety.

While the invention has been described using trench-gate MOSFET embodiments, implementation of the invention in other gate structures with a thick bottom dielectric as well as other types of power devices would be obvious to one skilled in the art in view of this disclosure. For example, the thick bottom dielectric may be implemented in a structure that includes only the Schottky diode of FIG. 3. As another example, FIGS. 4A-4M show cross-section views at various steps in a manufacturing process for forming a shielded gate trench FET with a TBD formed in accordance with an embodiment of the invention.

Figure 4A:
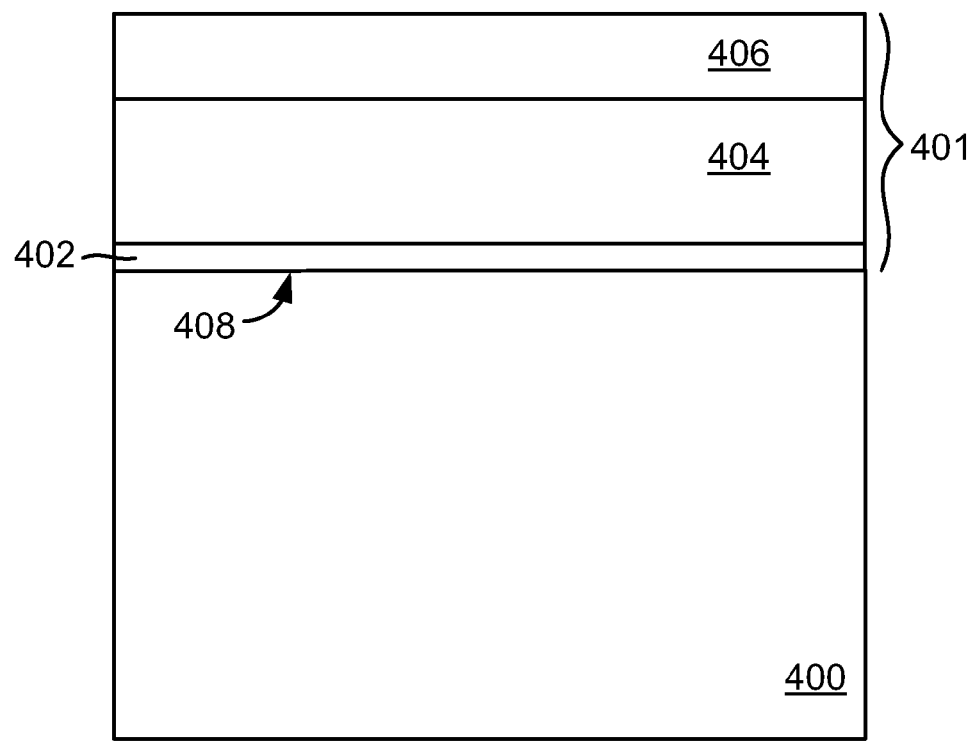
FIGS. 4A-4M show simplified cross-section views at various steps in a manufacturing process for forming a semiconductor structure which includes a shielded gate trench FET with a TBD, in accordance with an embodiment of the invention.
Figure 4B:
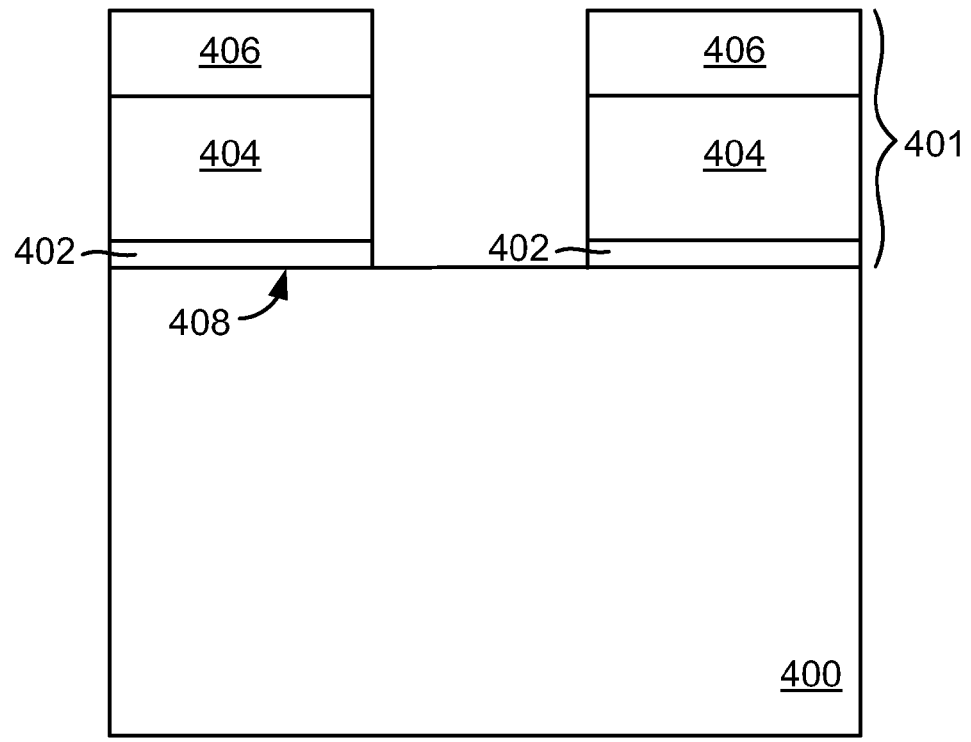
Figure 4C:
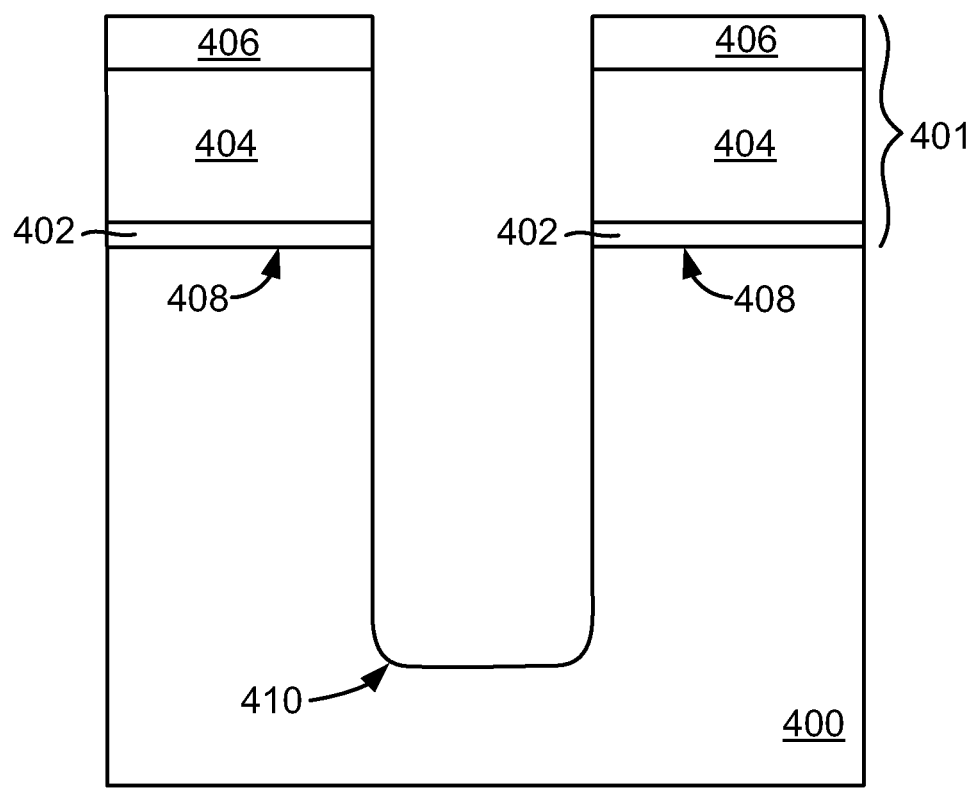

FIGS. 4A and 4B depict the formation and patterning of hard mask 401 and correspond to previously described FIGS. 1A and 1B and thus are not described here in detail. In FIG. 4C, a conventional anisotropic etch may be used to form trench 410 extending into semiconductor region 400. Trench 410 may extend deeper into semiconductor region 400 than the trenches in non-shielded gate embodiments to accommodate a shield electrode. As illustrated in FIG. 4C, a top layer of second insulating layer 406 may be removed during the trench etch process thus reducing the thickness of second insulating layer 406. Where trench 410 extends deeper than trench 110 in FIG. 1C, second insulating layer 406 in FIG. 4A may be formed thicker than second insulating layer 106 in FIG. 1A to ensure that at least a portion of second insulating layer 406 remains after the formation of trench 410.

Figure 4D:
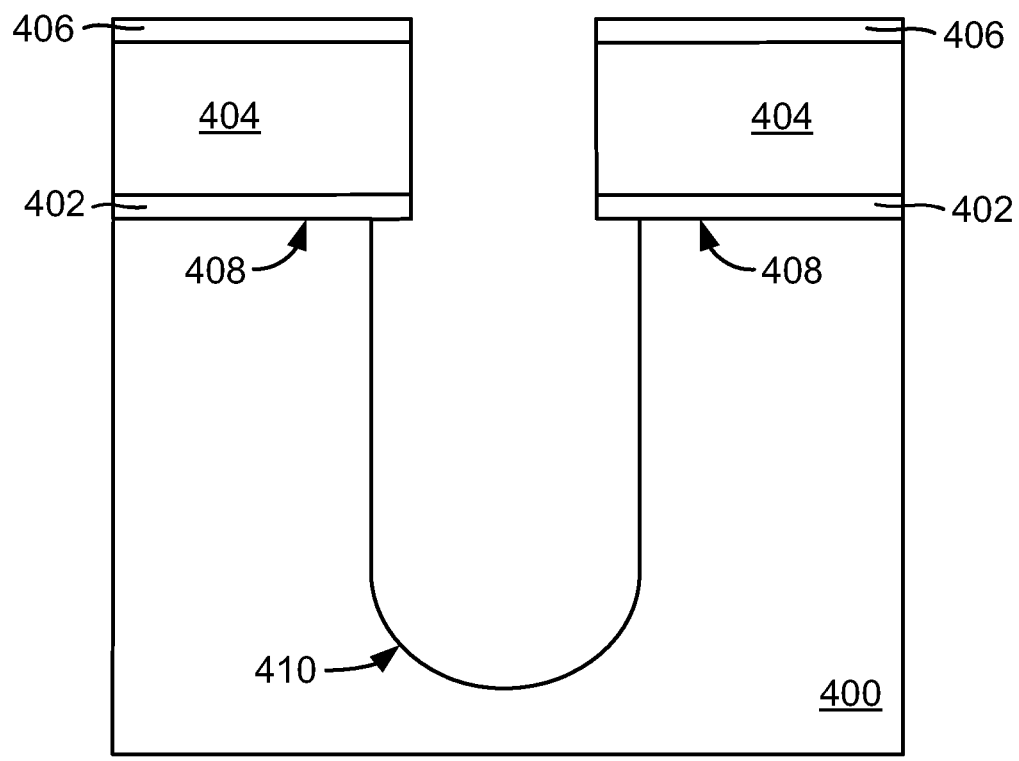
Figure 4E:
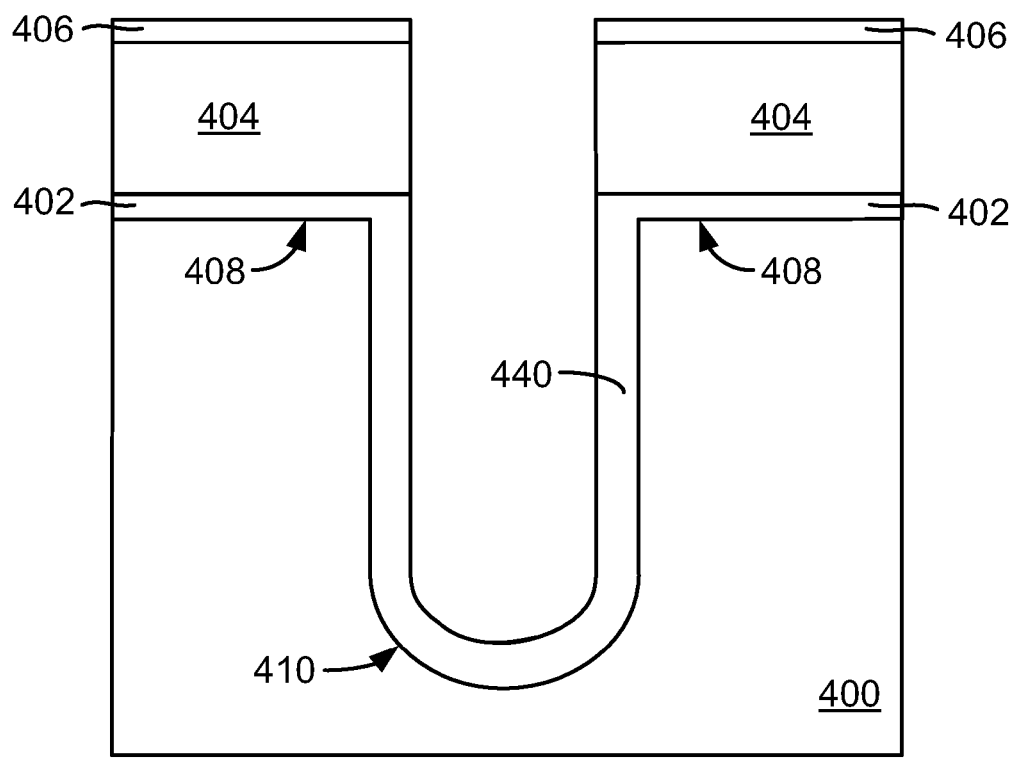

In FIG. 4D, the bottom corners of trench 410 are rounded to reduce defect density in a manner similar to that described with regard to FIG. 1D. In FIG. 4E, shield dielectric 440 is formed covering the sidewalls and bottom of trench 410 using known techniques. Following the formation of shield dielectric 440, a substantially vertical profile along the sidewalls of trench 410 and the edge of hard mask 401 may be desired. Thus, depending on the desired thickness of shield dielectric 440, the sidewalls of trench 410 may be recessed accordingly during the corner rounding process depicted in FIG. 4D.

Figure 4F:
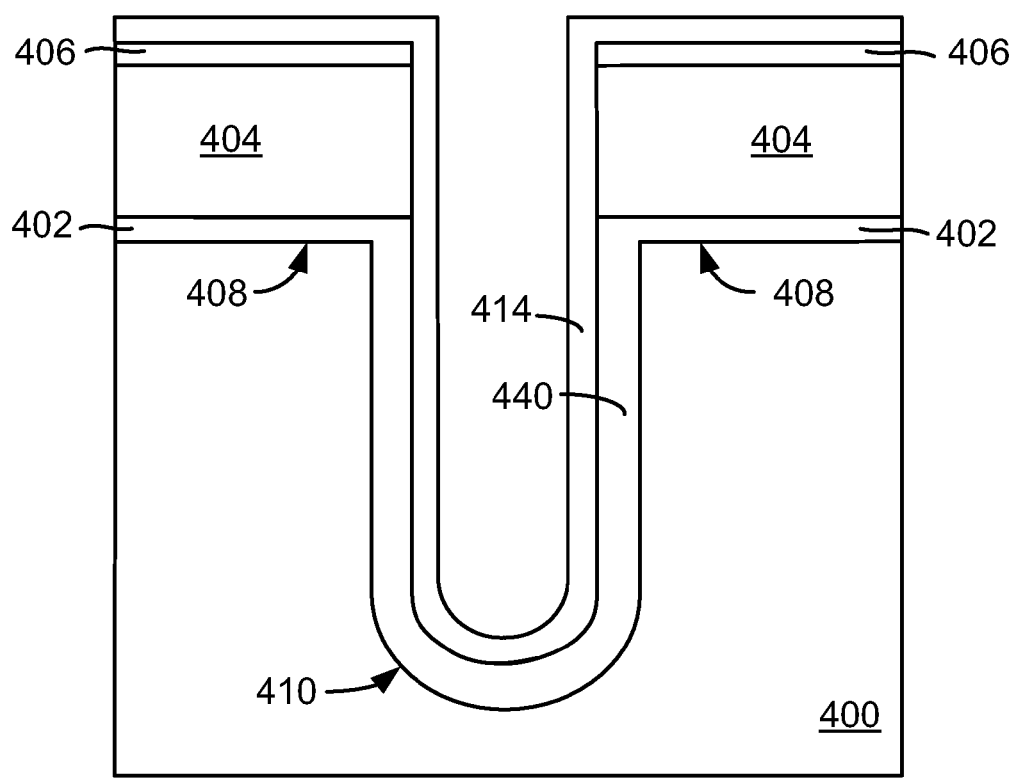
Figure 4G:
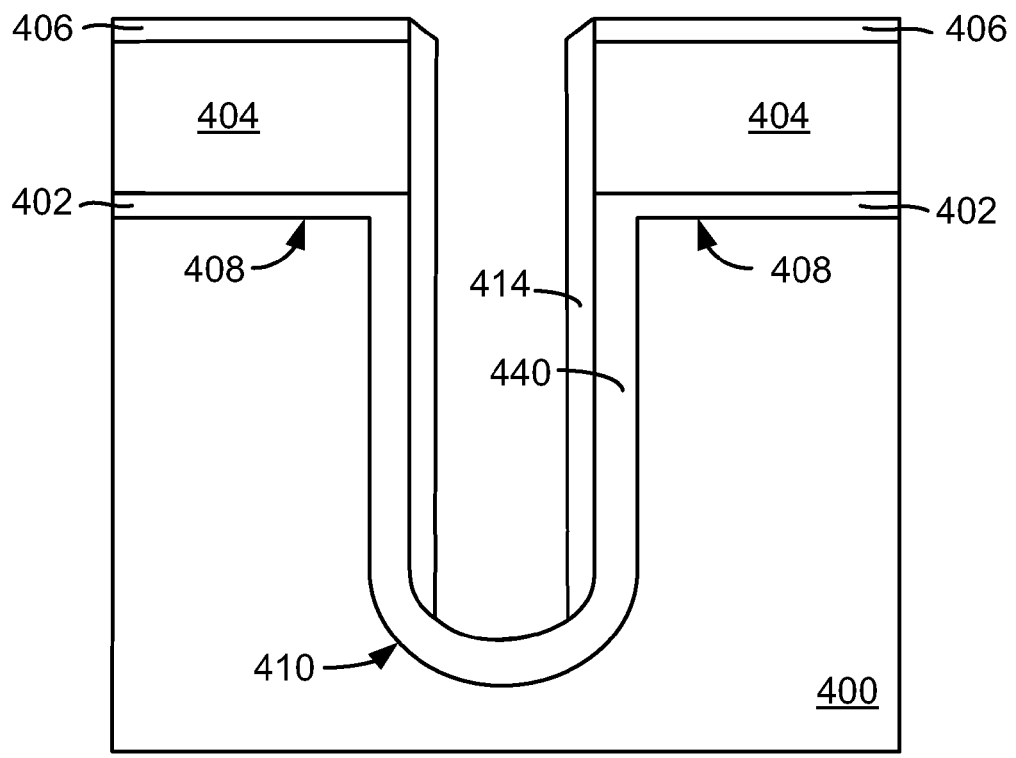

In FIG. 4F, second oxidation barrier layer 414 is formed over shield dielectric 440 along the sidewalls and bottom of trench 410 and over hard mask 401 in a manner similar to that described with regard to FIG. 1F. In FIG. 4G, portions of second oxidation barrier layer 414 are removed from the surface of hard mask 401 and along the bottom of trench 410 in a manner similar to that described with regard to FIG. 1G.

Figure 4H:
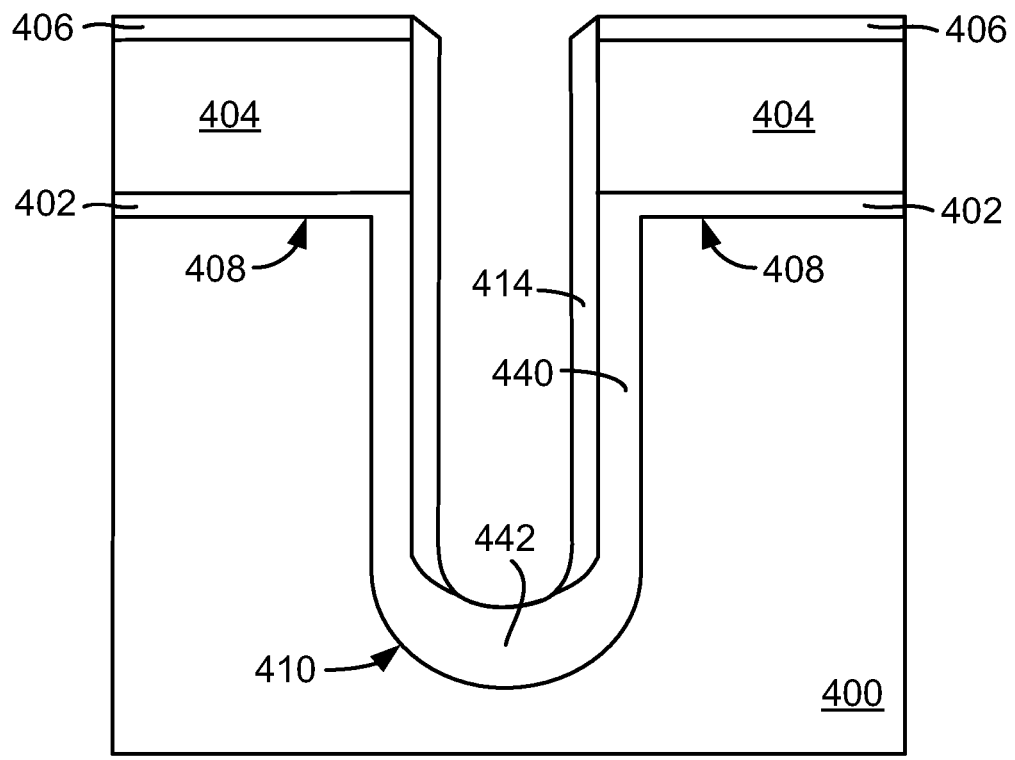
Figure 4I:
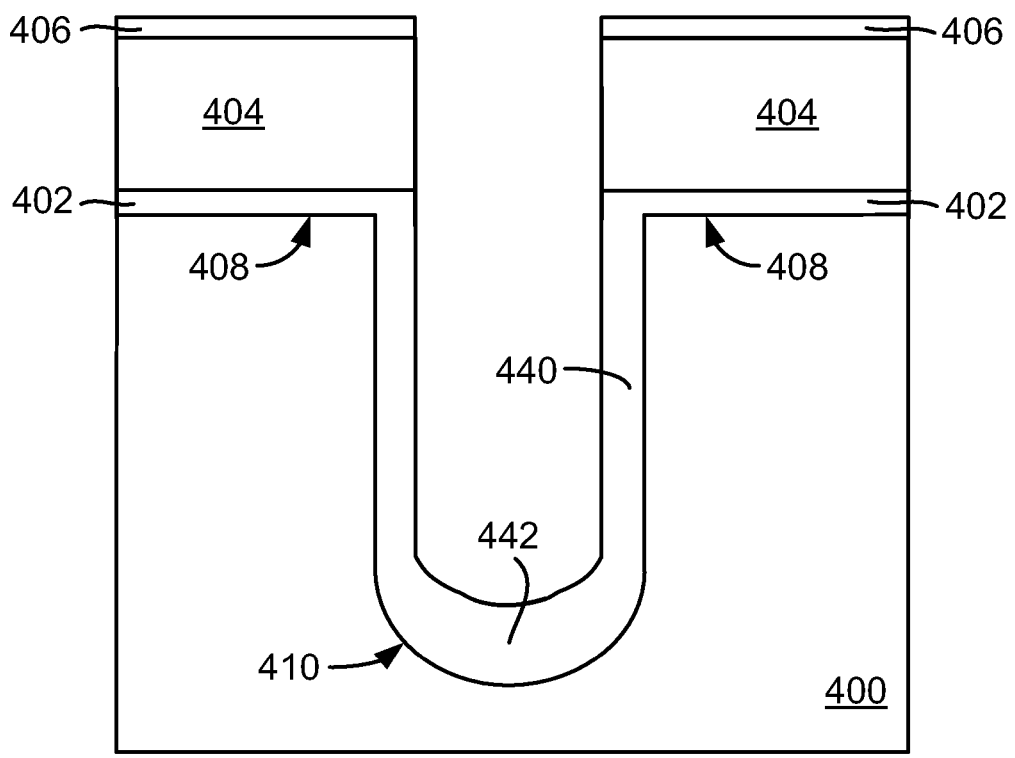

In FIG. 4H, a thick bottom dielectric (TBD) 442 is formed along the trench bottom where second oxidation barrier layer 414 is removed, in a manner similar to that described with regard to FIG. 1H. In FIG. 4I, a conventional etch process is carried out to remove second oxidation barrier layer 414 from the sidewalls of trench 410. In one embodiment, second oxidation barrier layer 414 comprises silicon nitride and is removed using a conventional silicon nitride etch process.

Figure 4J:
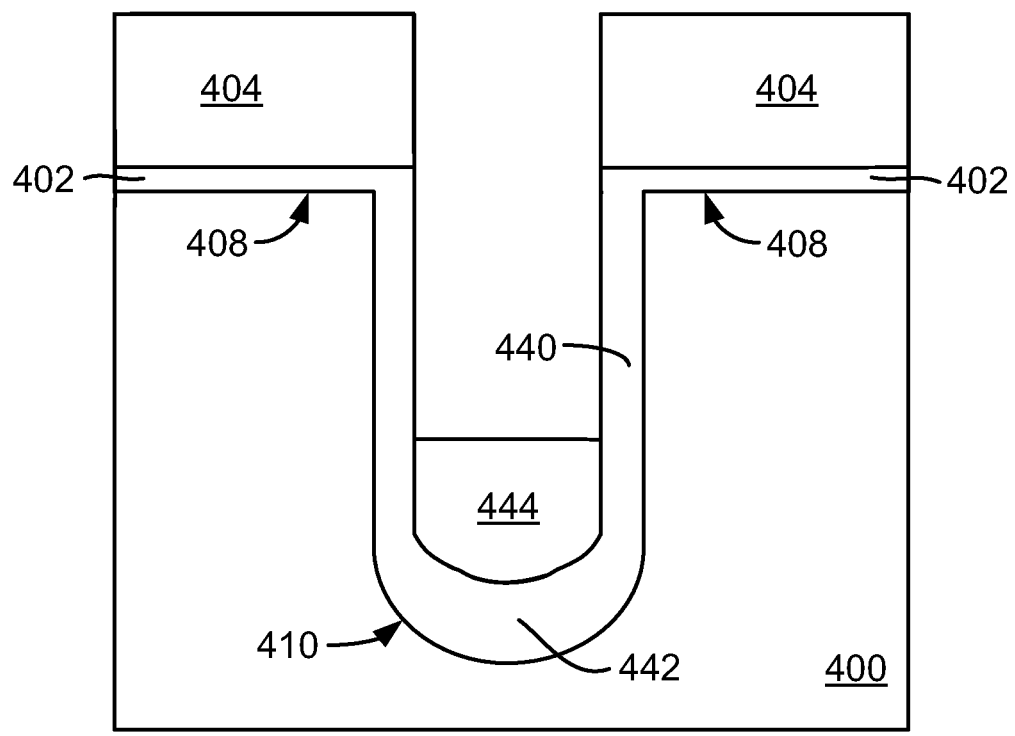

In FIG. 4J, shield electrode 444 is formed in the lower portion of trench 410 over TBD 442 using known techniques. In one embodiment, shield electrode 444 comprises doped or undoped polysilicon. The polysilicon may be deposited in trench 410 and then etched using a standard dry etch process to recess the polysilicon in the lower portion of trench 410. While in conventional shielded gate trench FET processes, a thick oxide is typically formed to protect the mesa surfaces during the polysilicon deep recess etch, the need for forming such a thick oxide over the mesa surfaces is eliminated since previously formed first oxidation barrier layer 404 advantageously protects mesa surfaces 408 during the polysilicon deep recess etch. Second insulating layer 406 may be completely removed during the polysilicon recess etch process.

Figure 4K:
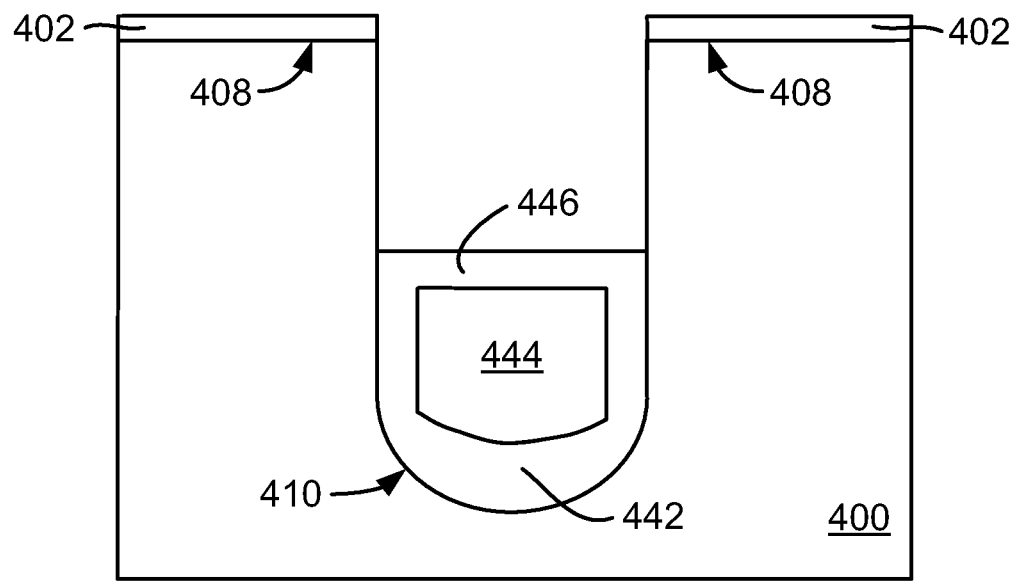

In FIG. 4K, inter-electrode dielectric (IED) layer 446 is formed over shield electrode 444. In one embodiment, IED layer 446 comprises oxide and is formed using standard CVD and etch techniques. The oxide may be deposited in trench 410 and etched using a standard dry and/or wet etch to form IED layer 446 over shield electrode 444. In one embodiment, only dry etch is advantageously used to recess the deposited oxide. In conventional processes for forming the IED layer, after depositing oxide using a CVD process, the deposited oxide typically needs to be recessed deep into the trench and thus requires both dry etch and wet etch processes. However, because of the presence of first oxidation barrier layer 404 (e.g., comprising silicon nitride) protecting mesa surfaces 408, the deep recessing of the deposited oxide may be carried out using only dry etch. This is advantageous in that dry etch is a more controllable etch than wet etch, thus resulting in a more uniform IED layer. The etch process may also remove shield dielectric 440 from along the upper sidewalls of trench 410.

Figure 4L:
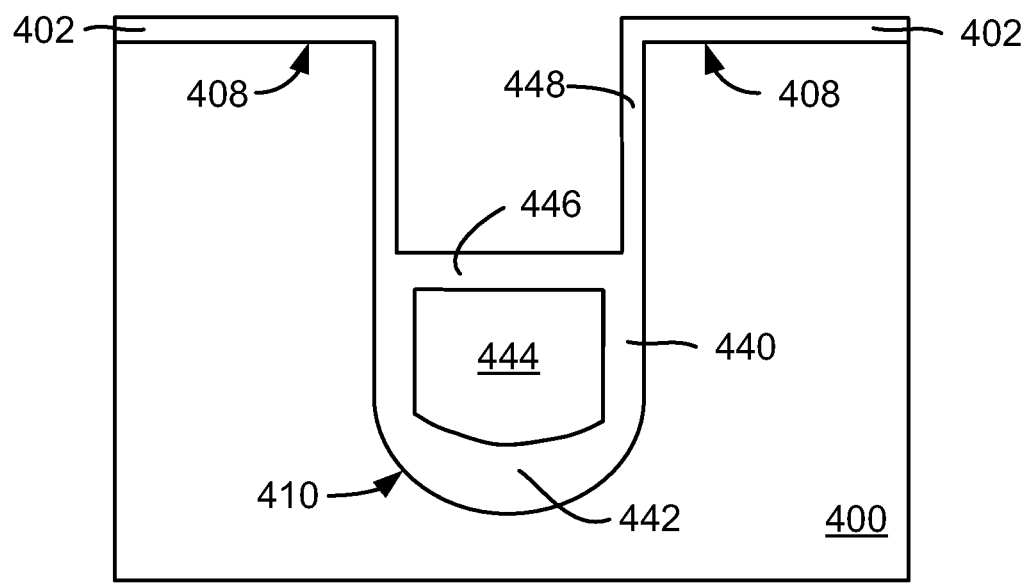

In FIG. 4L, gate dielectric layer 448 is formed along the upper sidewalls of trench 410. In one embodiment, gate dielectric layer 448 comprises oxide having a thickness in the range of 100-700 Å and is formed using conventional techniques. In some embodiments, gate dielectric layer 448 is thinner than shield dielectric 440.

Figure 4M:
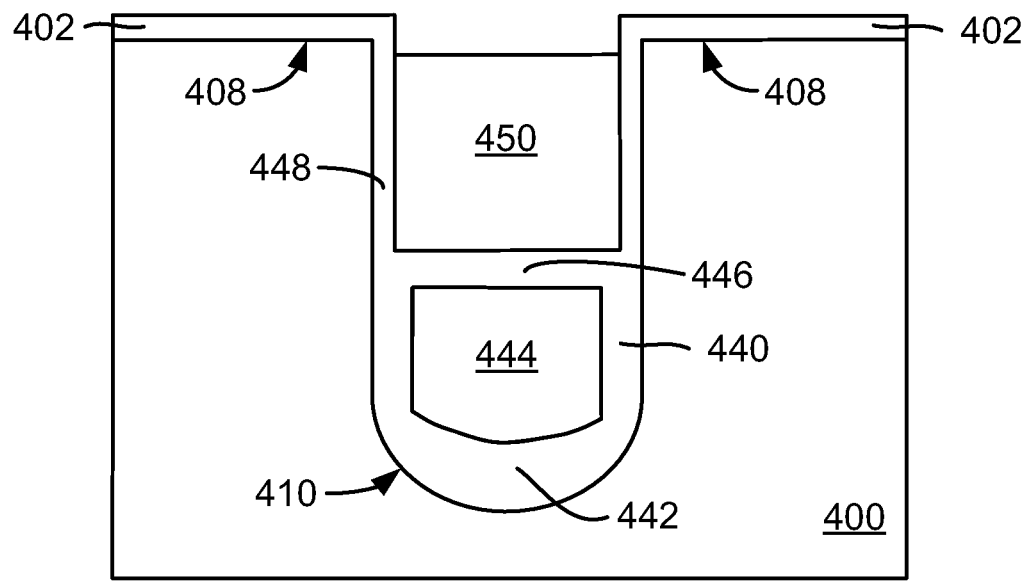

In FIG. 4M, gate electrode 450 is formed in trench 410 over IED layer 446 and gate dielectric layer 448. In one embodiment, gate electrode 450 comprises doped or undoped polysilicon and is formed using conventional techniques. A dry etch process may be used to remove portions of the polysilicon extending over the mesa regions. The etch process may recess gate electrode 450 below surface 408 of semiconductor region 400.

As can be seen in FIGS. 4C-4D, second insulating layer 406 covers and protects first oxidation barrier layer 404 during trench formation and the trench corner rounding processes. First oxidation barrier layer 404 in turn prevents the formation of a thick dielectric over surfaces 408 during formation of TBD 442. First oxidation barrier layer 404 also protects mesa surfaces 408 during the polysilicon deep recess etch depicted in FIG. 4J. Furthermore, in forming IED 446 depicted in FIGS. 4J and 4K, the presence of first oxidation barrier layer 404 during the deep oxide recess enables use of only a dry etch process (as opposed to both dry and wet etch process used in conventional techniques), thus resulting in formation of a uniform IED. In one embodiment, first oxidation barrier layer 404 is removed following the formation of IED layer 446 using conventional etch processes. In other embodiments, first oxidation barrier layer 404 is not removed until after the formation of gate dielectric 448 or after formation of gate electrode 450.

Also, unlike conventional shielded gate structures where the dielectric layer along the trench bottom and along the lower trench sidewalls are formed at the same time, TBD 442 is formed along the trench bottom separately from shield dielectric 440 formed along lower trench sidewalls. This enables each of these dielectric regions to be independently designed to achieve the desired device characteristics. For example, where shield electrode 444 is tied to the source potential, shield dielectric 440 may be made thinner for improved charge balance, which in turn allows the doping concentration in the drift region to be increased (thus reducing the on-resistance) for the same breakdown voltage characteristics. Alternatively, where shield electrode 444 is tied to the gate potential, an accumulation region may be formed in the drift region along the lower trench sidewalls when the FET is turned on. The accumulation region in turn helps reduce the transistor on-resistance. By using a thin shield dielectric 440, the accumulation effect can be enhanced, while a thick dielectric layer may be used as TBD 442 to minimize the gate to drain capacitance. In yet another variation where shield electrode 444 is tied to the drain, the high voltage typically present across shield dielectric 440 (where shield electrode 444 is tied to the source potential) is eliminated, thus a thinner shield dielectric 440 may be used without concerns of shield dielectric breakdown. In yet another embodiment where a high voltage FET is desired and shield electrode 444 is tied to the source potential, shield electrode 440 can be made as thick as necessary to ensure that shield dielectric 440 sustains the high voltages. Techniques for tying shield electrode 444 to one of source, drain, or gate potential are well known in the art. Note that the invention is not limited to the above combinations of shield electrode biasing, shield dielectric thicknesses, and drift region doping concentrations. Other combinations are also possible depending on the design goals and the target application.

Figure 5:
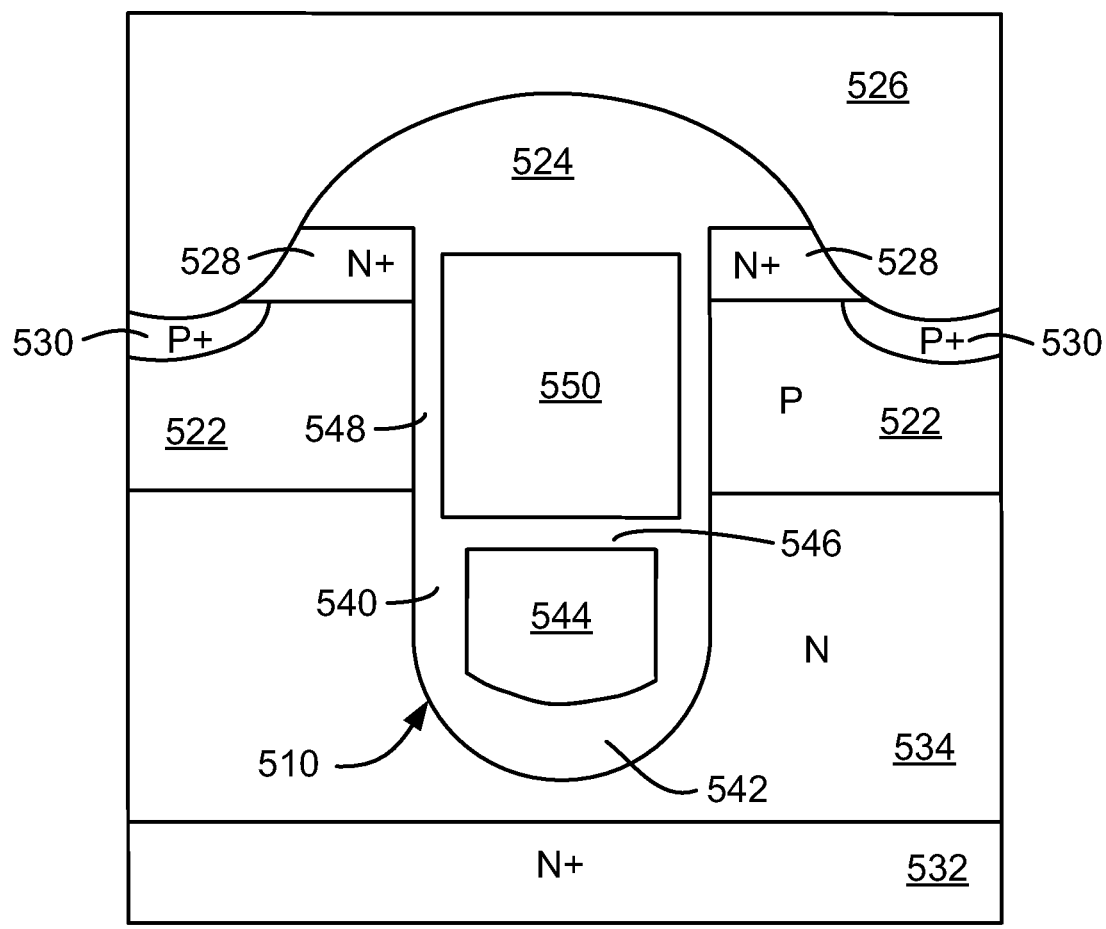
FIG. 5 shows a simplified cross-section view of a shielded gate trench FET structure, in accordance with an embodiment of the invention.

Referring back to FIG. 4M, with the formation of shield electrode 444 and gate electrode 450, the remaining portions of the shielded gate trench FET structure can be formed using any one of a number of known techniques. FIG. 5 shows a cross-section view of such a shielded gate trench FET structure, in accordance with an embodiment of the invention.

In FIG. 5, N-type epitaxial layer overlies highly doped N+ type substrate 532. Body region 522 of P-type conductivity and source regions 528 of N-type conductivity are formed in an upper portion of epitaxial layer 534 using conventional ion implantation techniques. The portion of epitaxial layer 534 bounded by body region 522 and substrate 532 forms what is commonly known as the drift region. Trench 510 extends into epitaxial layer 534 and terminates in the drift region. In an alternative embodiment, trench 510 may extend through the drift region and terminate in substrate 532. TBD 542 is formed along the bottom of trench 510, and shield dielectric 540 is formed along the lower sidewalls of trench 510 adjacent to shield electrode 544. Gate dielectric layer 548 is formed along the upper trench sidewalls adjacent to gate electrode 550. IED layer 546 is formed between shield electrode 544 and gate electrode 550.

The cross section in FIG. 5 corresponds to an embodiment where an open cell configuration is used with source regions 528 and trenches 510 being stripe-shaped and extending parallel to one another. In this embodiment, conventional techniques are used to form heavy body regions 530 of P-type conductivity periodically or continuously along the source stripes. Dielectric dome 524 extends over the trench and portions of source regions 528. A top source interconnect layer 526 (e.g., comprising metal) contacting source regions 528 may be formed over the structure. A backside drain interconnect layer (e.g., comprising metal) contacting the backside of substrate 532 may be formed. The structure and method of the present invention are not limited to open cell configuration. The implementation of the present invention in a closed cell configuration would be obvious to one skilled in the art in view of this disclosure.

The process depicted in FIGS. 4A-4M and the shielded gate trench FET structure shown in FIG. 5 can also be advantageously integrated with other device structures. For example, FIG. 6 shows a cross-section view of a monolithically integrated shielded gate trench FET and Schottky diode, in accordance with another embodiment of the invention.

Figure 6:
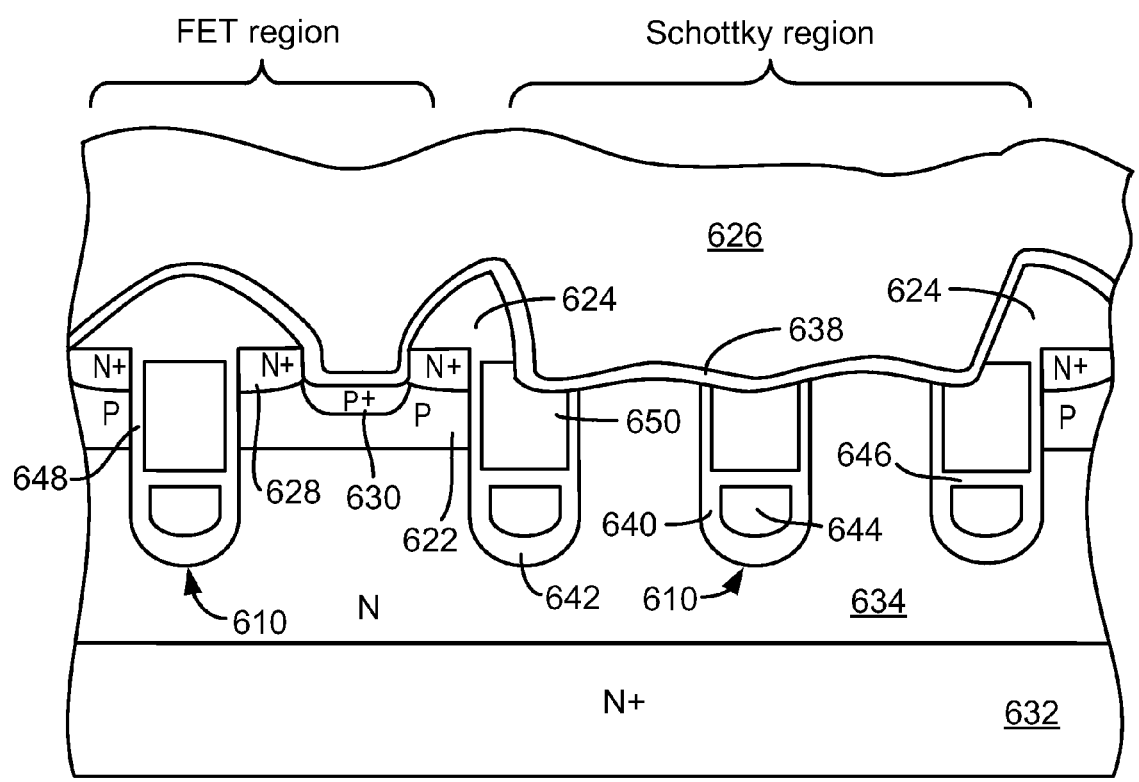
FIG. 6 shows a simplified cross-section view of a monolithically integrated shielded gate trench FET and Schottky diode, in accordance with another embodiment of the invention.

In FIG. 6, N-type epitaxial layer 634 overlies a highly doped N+ type substrate 632. A plurality of trenches 610 extend to a predetermined depth within the drift region (bounded by substrate 632 and body region 622) or alternatively extend into and terminate within substrate 532. Shield electrodes 644 are embedded in each trench 610 and are insulated from the epitaxial layer 634 by TBD 642 and shield dielectric 640. Gate electrodes 650 are formed in the upper portion of each trench 610 and are insulated by gate dielectric 648. Gate electrodes 650 and shield electrodes 644 are separated by IED layer 646. In one embodiment, trenches 610 in the Schottky region may contain only a single electrode (e.g., shield electrodes 644 or gate electrodes 650) while trenches 610 in the FET region contain both shield electrodes 644 and gate electrodes 650. This may be accomplished using conventional masking techniques during the steps for forming the gate and shield electrodes.

P-type body regions 622 laterally extend between adjacent trenches 610 in the FET region and vertically along the trench sidewalls. Highly doped N+ type source regions 628 are located directly above body regions 622 adjacent to the trench sidewalls. Source regions 628 vertically overlap gate electrode 650. When the trench-gate MOSFET is turned on, a vertical channel is formed in the body regions 622 between each source region 628 and the epitaxial layer 634 along the trench sidewalls.

In FIG. 6, a conformal barrier layer 638 is formed over the FET and Schottky regions. As can be seen, barrier layer 638 is substantially planar in the Schottky region and extends over dielectric caps 624 in the FET region. Conductive layer 626 is formed over barrier layer 638. Conductive layer 626 and barrier layer 638 form the topside interconnect which electrically contacts heavy body regions 630 and source regions 628 but is insulated from gate electrodes 650 in the FET region. In the Schottky region, a Schottky contact is formed where the topside interconnect contacts the mesa surfaces between adjacent trenches. Thus, the topside interconnect serves as the anode electrode of the Schottky diode in the Schottky region, and as the source interconnect of the FET in the FET region. A backside interconnect (not shown) contacts substrate 632 and thus serves as the cathode electrode in the Schottky region and as the source interconnect in the FET region.

Note that while the embodiments depicted by FIGS. 2, 3, 5, and 6 show n-channel FETs, p-channel FETs may be obtained by reversing the polarity of the various semiconductor regions. Further, in the embodiment where regions 200, 300, 500, 600 are epitaxial layers extending over a substrate, MOSFETs are obtained where the substrate and the epitaxial layer are of the same conductivity type, and IGBTs are obtained where the substrate has the opposite conductivity type to that of the epitaxial layer.

Although a number of specific embodiments are shown and described above, embodiments of the invention are not limited thereto. For example, it is understood that the doping polarities of the structures shown and described could be reversed and/or the doping concentrations of the various elements could be altered without departing from the invention. Also, the various embodiments described above may be implemented in silicon, silicon carbide, gallium arsenide, gallium nitride, diamond, or other semiconductor materials. Further, the features of one or more embodiments of the invention may be combined with one or more features of other embodiments of the invention without departing from the scope of the invention.

Therefore, the scope of the present invention should be determined not with reference to the above description but should instead be determined with reference to the appended claims, along with their full scope of equivalents.

What is claimed is:

1. A semiconductor structure, comprising:
   a trench disposed in a semiconductor region and including a sidewall, a lower portion, and a bottom portion;
   a shield electrode disposed in the lower portion of the trench;
   a gate electrode disposed in an upper portion of the trench;
   a sidewall dielectric lining a sidewall of the trench;
   a thick bottom dielectric lining the bottom portion of the trench, a thickness of the thick bottom dielectric being different than a thickness of the sidewall dielectric; and
   a mesa surface disposed adjacent to the trench, the thick bottom dielectric not being disposed over any portion of the mesa surface.

2. The semiconductor structure of claim 1, the thickness of the thick bottom dielectric being greater than the thickness of the sidewall dielectric.

3. The semiconductor structure of claim 1, further comprising:
   a drift region, and
   the trench being disposed in the drift region.

4. The semiconductor structure of claim 1, further comprising:
   a Schottky diode formed in a non-FET region.

5. The semiconductor structure of claim 1, further comprising:
   a dielectric dome disposed over the trench, and
   the gate electrode disposed between the thick bottom dielectric, the sidewall dielectric, and the dielectric dome.

6. The semiconductor structure of claim 1, further comprising:
   a gate dielectric lining the upper portion of the trench.

7. The semiconductor structure of claim 6, wherein the gate dielectric has a thickness less than the thickness of the sidewall dielectric.

8. The semiconductor structure of claim 1, further comprising an inter-electrode dielectric disposed between the shield electrode and the gate electrode.

9. The semiconductor structure of claim 1, wherein the shield electrode includes undoped polysilicon.

10. The semiconductor structure of claim 1, further comprising:
    a drift region including a top surface, and
    the shield electrode including a top surface that is disposed below the top surface of the drift region.

11. The semiconductor structure of claim 1, wherein the thickness of the thick bottom dielectric is greater than the thickness of the sidewall dielectric.

12. An apparatus, comprising:
    a field-effect transistor (FET) region including:
        a FET trench disposed in a semiconductor region and including a sidewall and a bottom portion,
        a FET sidewall dielectric lining a sidewall of the FET trench,
        a FET shield electrode disposed in a lower portion of the FET trench,
        a FET gate electrode disposed in an upper portion of the FET trench, and
        a FET thick bottom dielectric lining the bottom portion of the FET trench, the FET thick bottom dielectric having a thickness different than a thickness of the FET sidewall dielectric; and
    a non-field-effect transistor (FET) region including:
        a non-FET trench disposed in the semiconductor region and including a sidewall and a bottom portion,
        a non-FET sidewall dielectric lining a sidewall of the non-FET trench, and
        a non-FET thick bottom dielectric lining the bottom portion of the non-FET trench, the non-FET thick bottom dielectric having a thickness different than a thickness of the non-FET sidewall dielectric.

13. The apparatus of claim 12, wherein the non-FET region includes a Schottky diode,
    the Schottky diode includes the non-FET trench, the non-FET sidewall dielectric, and the non-FET thick bottom dielectric.

14. The apparatus of claim 12, further comprising:
    an interconnect layer functioning as an anode electrode of the non-FET region and as a source interconnect of a source region of the FET region.

15. The apparatus of claim 12, wherein the non-FET region is a first non-FET trench,
    the apparatus further comprising:
    a second non-FET trench, and
    a mesa surface disposed between the first non-FET trench and the second non-FET trench; and
    an interconnect layer disposed over the FET region and over the non-FET region such that the interconnect layer contacts the mesa surface and contacts a source region of the FET region.

16. The apparatus of claim 12, further comprising:
    an interconnect layer disposed over the FET region and over the non-FET region such that the interconnect layer contacts a mesa surface included in the non-FET region to form a Schottky contact.

17. The apparatus of claim 12, wherein the FET region further including:
    a FET inter-electrode dielectric disposed between the FET shield electrode and the FET gate electrode;
    a FET shield dielectric lining the lower portion of the sidewall of the FET trench; and
    a FET gate dielectric lining the upper portion of the sidewall of the FET trench, the FET gate dielectric having a thickness less than a thickness of the FET shield dielectric.

18. An apparatus, comprising:
    a field-effect transistor (FET) region including:
        a first trench disposed in a semiconductor region and including a sidewall and a bottom portion,
        a sidewall dielectric lining a sidewall of the trench,
        a shield electrode disposed in a lower portion of the trench,
        a gate electrode disposed in an upper portion of the trench, and
        a first thick bottom dielectric lining the bottom portion of the trench, the thick bottom dielectric having a thickness greater than a thickness of the sidewall dielectric; and
    a Schottky diode disposed in a non-field-effect transistor (FET) region, the Schottky diode including a conductive layer contacting a mesa surface to form a Schottky contact,
    the non-FET region including:
        a second trench; and a second thick bottom dielectric lining the bottom portion of the second trench, the second thick bottom dielectric having a thickness equal to the thickness of the first thick bottom dielectric.

19. The apparatus of claim 18, wherein the shield electrode is a first shield electrode, the FET region further including:
an inter-electrode dielectric disposed between the first shield electrode and the gate electrode; and
a second shield electrode disposed in the second trench.

20. The apparatus of claim 18, wherein the gate electrode is a first gate electrode and the shield electrode is a first shield electrode, the FET region further including:
a second gate electrode disposed in the second trench; and
a second shield electrode disposed in the second trench.

21. The apparatus of claim 18, wherein the non-FET region further including:
a mesa surface disposed adjacent to the second trench, the second thick bottom dielectric not being disposed over any portion of the mesa surface.

22. The apparatus of claim 18, wherein the FET region further including:
a mesa surface disposed adjacent to the first trench, the first thick bottom dielectric not being disposed over any portion of the mesa surface.

23. An apparatus, comprising:
a field-effect transistor (FET) region including:
a FET trench disposed in a semiconductor region and including a sidewall and a bottom portion,
a FET sidewall dielectric lining a sidewall of the FET trench,
a FET electrode disposed in the FET trench, and
a FET thick bottom dielectric lining the bottom portion of the FET trench, the FET thick bottom dielectric having a thickness different than a thickness of the FET sidewall dielectric; and
a non-field-effect transistor (FET) region including:
a non-FET trench disposed in the semiconductor region and including a sidewall and a bottom portion,
a non-FET sidewall dielectric lining a sidewall of the non-FET trench, and
a non-FET thick bottom dielectric lining the bottom portion of the non-FET trench, the non-FET thick bottom dielectric having a thickness different than a thickness of the non-FET sidewall dielectric.

24. The apparatus of claim 23, further comprising:
a Schottky diode in the non-FET region, the Schottky diode being associated with the non-FET trench, the non-FET sidewall dielectric, and the non-FET thick bottom dielectric.

25. The apparatus of claim 23, wherein the FET electrode is a gate electrode disposed in an upper portion of the trench, the apparatus further comprising:
a FET shield electrode disposed in a lower portion of the FET trench.

26. The apparatus of claim 23, further comprising:
an interconnect layer functioning as an anode electrode of the non-FET region and as a source interconnect of a source region of the FET region.

27. The apparatus of claim 23, wherein the non-FET region is a first non-FET trench,
the apparatus further comprising:
a second non-FET trench, and
a mesa surface disposed between the first non-FET trench and the second non-FET trench; and
an interconnect layer disposed over the FET region and over the non-FET region such that the interconnect layer contacts the mesa surface and contacts a source region of the FET region.

28. The apparatus of claim 23, further comprising:
an interconnect layer disposed over the FET region and over the non-FET region such that the interconnect layer contacts a mesa surface included in the non-FET region to form a Schottky contact.

29. The apparatus of claim 23, wherein the thickness of the non-FET thick bottom dielectric is greater than the thickness of the non-FET sidewall dielectric.

30. The apparatus of claim 23, wherein the thickness of the FET thick bottom dielectric is greater than the thickness of the FET sidewall dielectric.

* * * * *